(12) United States Patent
Park et al.

(10) Patent No.: US 12,137,599 B2
(45) Date of Patent: Nov. 5, 2024

(54) DISPLAY APPARATUS

(71) Applicant: SAMSUNG DISPLAY CO., LTD., Yongin-si (KR)

(72) Inventors: Chanyoung Park, Yongin-si (KR); Jaekyung Go, Yongin-si (KR); Hyunmin Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/295,478

(22) Filed: Apr. 4, 2023

(65) Prior Publication Data

US 2023/0247889 A1 Aug. 3, 2023

Related U.S. Application Data

(62) Division of application No. 16/814,171, filed on Mar. 10, 2020, now Pat. No. 11,637,151.

(30) Foreign Application Priority Data

May 13, 2019 (KR) ........................ 10-2019-0055833

(51) Int. Cl.
*H10K 59/12* (2023.01)
*H10K 50/84* (2023.01)
*H10K 59/60* (2023.01)
*H10K 59/88* (2023.01)
*H10K 77/10* (2023.01)
(Continued)

(52) U.S. Cl.
CPC ........... *H10K 59/60* (2023.02); *H10K 50/841* (2023.02); *H10K 59/12* (2023.02); *H10K 59/88* (2023.02); *H10K 77/10* (2023.02);

*G06F 1/1686* (2013.01); *G06F 1/1688* (2013.01); *G09G 3/3258* (2013.01); *G09G 3/3266* (2013.01);
(Continued)

(58) Field of Classification Search
CPC ........ H10K 59/12; H10K 59/00; H10K 59/10; H10K 59/121; H10K 59/88
See application file for complete search history.

(56) References Cited

U.S. PATENT DOCUMENTS 9,146,413 B2 9/2015 Kim
10,021,368 B2 * 7/2018 Woo ..................... H04N 13/254
(Continued)

FOREIGN PATENT DOCUMENTS

CN 107977632 5/2018
EP 3226101 10/2017
(Continued)

OTHER PUBLICATIONS

Office Action dated Mar. 30, 2021 in corresponding U.S. Appl. No. 16/814,171.
(Continued)

*Primary Examiner* — Eduardo A Rodela
(74) *Attorney, Agent, or Firm* — F. Chau & Associates, LLC

(57) ABSTRACT

A display apparatus includes a substrate including a first region and a second region spaced apart from each other in a first direction, and a plurality of display elements arranged in a display area in which the first region and the second region are disposed. The first region and the second region are circular, a diameter of the first region is about equal to a diameter of the second region.

9 Claims, 25 Drawing Sheets

(51) Int. Cl.
*G06F 1/16* (2006.01)
*G09G 3/3258* (2016.01)
*G09G 3/3266* (2016.01)
*G09G 3/3275* (2016.01)
*H04M 1/02* (2006.01)
*H10K 59/40* (2023.01)

(52) U.S. Cl.
CPC ......... *G09G 3/3275* (2013.01); *H04M 1/0264* (2013.01); *H10K 59/40* (2023.02)

(56) References Cited

U.S. PATENT DOCUMENTS

| | | | |
|---|---|---|---|
| 10,910,461 B2* | 2/2021 | Lee | H10K 59/131 |
| 10,964,908 B2* | 3/2021 | Nam | H10K 59/121 |
| 11,057,554 B2 | 7/2021 | Nakamura et al. | |
| 11,637,151 B2* | 4/2023 | Park | H10K 59/88 |
| | | | 257/40 |
| 2013/0082288 A1* | 4/2013 | Kim | H10K 59/12 |
| | | | 257/89 |
| 2013/0094126 A1 | 4/2013 | Rappoport et al. | |
| 2013/0278729 A1 | 10/2013 | Choi | |
| 2015/0201130 A1 | 7/2015 | Cho et al. | |
| 2015/0301665 A1 | 10/2015 | Kim et al. | |
| 2017/0287992 A1* | 10/2017 | Kwak | H10K 59/40 |
| 2018/0196475 A1* | 7/2018 | Bao | G02F 1/133514 |
| 2018/0198067 A1 | 7/2018 | Kim et al. | |
| 2018/0239425 A1 | 8/2018 | Jang | |
| 2019/0172887 A1 | 6/2019 | Sun et al. | |
| 2019/0363266 A1 | 11/2019 | Tanaka | |
| 2020/0013842 A1* | 1/2020 | Lee | H10K 59/00 |
| 2020/0168691 A1* | 5/2020 | Choi | H10K 50/858 |
| 2020/0265204 A1* | 8/2020 | Lee | H04M 1/0266 |
| 2020/0365817 A1 | 11/2020 | Park et al. | |

FOREIGN PATENT DOCUMENTS

| | | |
|---|---|---|
| EP | 3379576 | 9/2018 |
| EP | 3428967 | 1/2019 |
| KR | 10-2017-0111827 | 10/2017 |
| KR | 10-2017-0113066 | 10/2017 |
| KR | 10-2017-0137230 | 12/2017 |
| KR | 10-1848871 | 4/2018 |
| KR | 10-2018-0096434 | 8/2018 |
| WO | 2018138779 | 8/2018 |
| WO | 2018216545 | 11/2018 |

OTHER PUBLICATIONS

Final Office Action dated Sep. 30, 2021 in corresponding U.S. Appl. No. 16/814,171.

Office Action dated Dec. 13, 2021 in corresponding U.S. Appl. No. 16/814,171.

Office Action dated Jun. 20, 2022 in corresponding U.S. Appl. No. 16/814,171.

* cited by examiner

DISPLAY APPARATUS

CROSS-REFERENCE TO RELATED APPLICATIONS TECHNICAL FIELD

This application is a divisional application of U.S. patent application Ser. No. 16/814,171 filed Mar. 10, 2020, which claims priority under 35 U.S.C. § 119 to Korean Patent Application No. 10-2019-0055833, filed on May 13, 2019 in the Korean Intellectual Property Office, the disclosures of which are incorporated by reference herein in their entirety.

TECHNICAL FIELD

Exemplary embodiments of the present disclosure relate to a display apparatus, and more particularly, to a display apparatus having improved durability.

DISCUSSION OF THE RELATED ART

As advancements continue to be made in display technology, including decreasing the thickness and weight of display apparatuses, the range of use of display apparatuses has increased. Since display apparatuses may be utilized in various ways, various methods may be used to design the shapes of display apparatuses.

SUMMARY

Conventional display apparatuses may have various structures such that a display apparatus is arranged to overlap various other apparatuses (e.g., sensors). In this case, the display apparatus may include an opening area (e.g., a through hole) to arrange the various other apparatuses therewithin. When a display apparatus includes two opening areas and an external impact is applied to the display apparatus, stress may be concentrated on a boundary of the two opening areas, which may damage the boundary of the opening areas. Exemplary embodiments include a display apparatus having an opening area that is not damaged or destroyed, even when an impact is applied to the display apparatus.

According to an exemplary embodiment, a display apparatus includes a substrate including a first region and a second region spaced apart from each other in a first direction, and a plurality of display elements arranged in a display area in which the first region and the second region are disposed. The first region and the second region are circular, a diameter of the first region is about equal to a diameter of the second region.

In an exemplary embodiment, the substrate is rectangular and includes two shorter edges and two longer edges, and the first region and the second region are symmetrical to each other about a center line that passes through respective centers of the two shorter edges.

In an exemplary embodiment, the substrate is rectangular and includes two shorter edges and two longer edges, and the first region and the second region are located between one of the two longer edges and a center line that passes through respective centers of the two shorter edges.

In an exemplary embodiment, the substrate is rectangular and includes two shorter edges and two longer edges, and a distance from one of the first region and the second region that is closer to one of the two shorter edges to the one shorter edge is about ⅕ or greater of a length of one of the two longer edges.

In an exemplary embodiment, the substrate is rectangular and includes two shorter edges and two longer edges, and a distance between a center of the first region and a center of the second region is about ⅔ or less of a length of one of the two shorter edges.

In an exemplary embodiment, the substrate is rectangular and includes two shorter edges and two longer edges, one of the first region and the second region is closer to one of the longer edges than the other one of the first region and the second region is, and a distance from a center of the one of the first region and the second region that is closer to the one of the longer edges to the one of the longer edges is about ½ or greater of a distance from a center line that passes through respective centers of the two shorter edges.

In an exemplary embodiment, the substrate is rectangular and includes two shorter edges and two longer edges, and one of the first region and the second region is located on a center line that passes through respective centers of the two shorter edges and is parallel to the two longer edges.

In an exemplary embodiment, the display apparatus further includes a plurality of through holes arranged in at least one of the first region and the second region that penetrate through the substrate.

In an exemplary embodiment, the display apparatus further includes an encapsulation substrate that faces the substrate, and a plurality of through holes arranged in at least one of the first region and the second region. The through holes penetrate through at least one of the substrate and the encapsulation substrate.

In an exemplary embodiment, the display apparatus further includes a transparent material layer arranged in at least one of the first region and the second region.

According to an exemplary embodiment, a display apparatus includes a substrate including a first region and a second region spaced apart from each other in a first direction, and a plurality of display elements arranged in a display area adjacent to the first region and the second region. The first region and the second region are circular, a diameter of the first region is different from a diameter of the second region, and none of the display elements are arranged in the first region and the second region.

In an exemplary embodiment, the substrate is rectangular and includes two shorter edges and two longer edges, and one of the first region and the second region is located on a center line that passes through respective centers of the two shorter edges and is parallel to the two longer edges.

In an exemplary embodiment, a diameter of the one of the first region and the second region is less than a diameter of the other one of the first region and the second region.

In an exemplary embodiment, the substrate is rectangular and includes two shorter edges and two longer edges, one of the first region and the second region is closer to one of the longer edges than the other one of the first region and the second region is, and a distance from a center of the one of the first region and the second region that is closer to the one of the longer edges to the one of the longer edges is about ½ or greater of a distance from a center line that passes through respective centers of the two shorter edges.

In an exemplary embodiment, the substrate is rectangular and includes two shorter edges and two longer edges, and a distance from one of the first region and the second region that is closer to one of the two shorter edges to the one shorter edge is about ⅕ or greater of a length of one of the two longer edges.

In an exemplary embodiment, the substrate is rectangular and includes two shorter edges and two longer edges, and a center of one of the first region and the second region that has a smaller diameter is closer to a center line that passes through respective centers of the two shorter edges and is parallel to the two longer edges than a center of the other one of the first region and the second region that has a larger diameter is.

In an exemplary embodiment, the display apparatus further includes a plurality of through holes arranged in at least one of the first region and the second region that penetrate through the substrate.

In an exemplary embodiment, the display apparatus further includes an encapsulation substrate that faces the substrate, and a plurality of through holes arranged in at least one of the first region and the second region. The through holes penetrate through at least one of the substrate and the encapsulation substrate.

In an exemplary embodiment, the display apparatus further includes a transparent material layer arranged in at least one of the first region and the second region.

According to an exemplary embodiment, a display apparatus includes a substrate including a first region and a second region, each having a circular shape and spaced apart from each other in a first direction, and a plurality of display elements arranged in a display area adjacent to the first region and the second region. The substrate is rectangular and has two shorter edges and two longer edges. The first region and the second region are arranged between a first inflection point of a first stress generated at a perpendicular distance from a first center line passing through a center of the display area and being parallel to the two shorter edges to each of the two shorter edges, or a second inflection point of a second stress generated at a perpendicular distance from a second center line passing through the center of the display area and being parallel to the two longer edges to each of the two longer edges and the second center line.

In an exemplary embodiment, one of the first region and the second region is closer to one of the longer edges than the other one of the first region and the second region is, and a distance from a center of the one of the first region and the second region that is closer to the one of the longer edges to the one of the longer edges is about ½ or greater of a distance from a third center line that passes through respective centers of the two shorter edges.

In an exemplary embodiment, a distance from one of the first region and the second region that is closer to one of the two shorter edges to the one shorter edge is about ⅕ or greater of a length of one of the two longer edges.

In an exemplary embodiment, a distance between a center of the first region and a center of the second region is about ⅔ or less of a length of one of the two shorter edges.

In an exemplary embodiment, a diameter of the first region is about equal to a diameter of the second region.

In an exemplary embodiment, a diameter of the first region is different from a diameter of the second region.

The display apparatus of claim 20, a center of one of the first region and the second region is arranged to be eccentric from respective centers of the two shorter edges, with respect to an arbitrary straight line that is parallel to the two longer edges and passes through the respective centers of the two shorter edges.

In an exemplary embodiment, the display apparatus further includes a plurality of through holes arranged in at least one of the first region and the second region that penetrate through the substrate.

In an exemplary embodiment, the display apparatus further includes an encapsulation substrate that faces the substrate, and a plurality of through holes arranged in at least one of the first region and the second region. The through holes penetrate through at least one of the substrate and the encapsulation substrate.

In an exemplary embodiment, the display apparatus further includes a transparent material layer arranged in at least one of the first region and the second region.

BRIEF DESCRIPTION OF THE DRAWINGS

The above and other aspects of the present disclosure will become more apparent by describing in detail exemplary embodiments thereof with reference to the accompanying drawings, in which.

DETAILED DESCRIPTION

Figure 1:
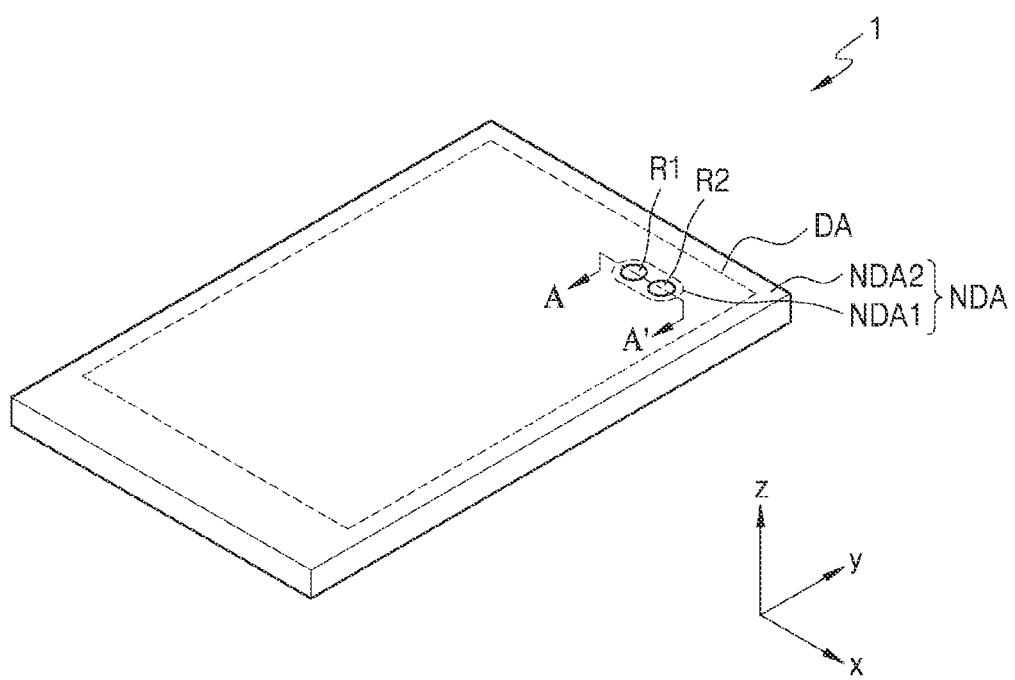
FIG. 1 is a schematic perspective view of a display apparatus according to an exemplary embodiment.

Exemplary embodiments of the present disclosure will be described more fully hereinafter with reference to the accompanying drawings. Like reference numerals may refer to like elements throughout the accompanying drawings.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain exemplary embodiment may be implemented differently, a specific process order may be performed differently from the described order. For example, two consecutively described processes may be performed substantially at the same time or performed in an order opposite to the described order.

Herein, when one value is described as being about equal to another value or being substantially the same as or equal to another value, it is to be understood that the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Further, when an element, such as an imaginary line, is described as being "substantially straight", it is to be understood that the element is exactly straight, or almost straight (e.g., within a measurement error), as would be understood by a person having ordinary skill in the art.

FIG. 1 is a schematic perspective view of a display apparatus 1 according to an exemplary embodiment.

Referring to FIG. 1, the display apparatus 1 includes a display area DA that emits light and a non-display area NDA that does not emit light.

The display apparatus 1 may provide an image through the display area DA. The display apparatus 1 may include, for example, a liquid crystal display (LCD), an electrophoretic display, an organic light-emitting diode (OLED) display, an inorganic light-emitting display, a quantum-dot light emitting display, a field emission display, a surface-conduction electron-emitter display, a plasma display, or a cathode ray display.

Although an OLED display will now be illustrated and described as the display apparatus 1 according to an exemplary embodiment, the display apparatus according to the present disclosure is not limited thereto, and various types of display apparatuses may be used.

The display apparatus 1 includes a first region R1 and a second region R2. Electronic elements are arranged in the first region R1 and the second region R2, as will be described later with reference to the drawings. The first and second regions R1 and R2 may be understood as opening areas or transmission areas capable of transmitting light and/or sound that is output from the electronic elements to the outside, or that travels from the outside toward the electronic elements. The transmission area may have a shape in which a display panel has been partially removed. For example, the first region R1 and the second region R2 may be regions in which holes are formed in a main substrate and/or an encapsulation substrate, which will be described later.

According to an exemplary embodiment, when light passes through the first region R1 and the second region R2, the light transmittance may be about 50% or greater, for example, about 70% or greater, about 75% or greater, about 80% or greater, or about 85% or greater.

The non-display area NDA may include a first non-display area NDA1 surrounding the first and second regions R1 and R2, and a second non-display area NDA2 surrounding the display area DA. The first non-display area NDA1 may entirely surround the first and second regions R1 and R2, the display area DA may entirely surround the first non-display area NDA1, and the second non-display area NDA2 may entirely surround the display area DA.

Although the first and second regions R1 and R2 are positioned on the upper right side of the display area DA in FIG. 1, the disclosure is not limited thereto. For example, according to exemplary embodiments, the locations of the first region R1 and the second region R2 may vary.

Figure 2:
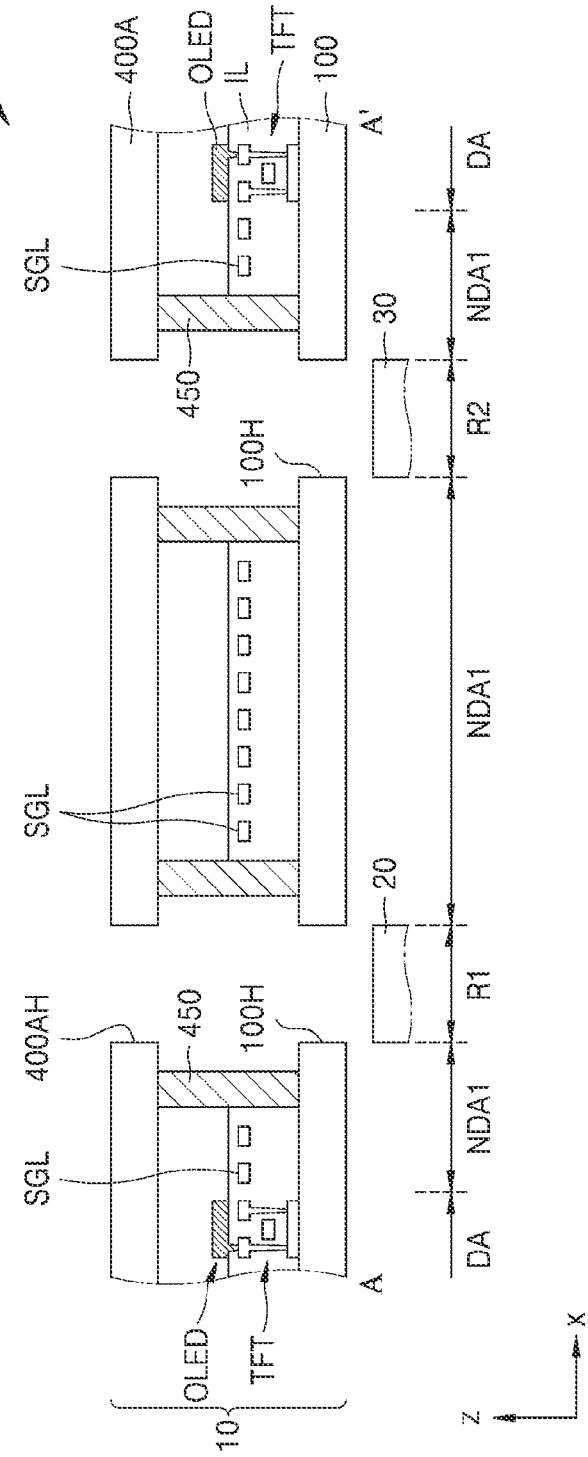
FIG. 2 is a cross-sectional view of an exemplary embodiment of a display panel of the display apparatus of FIG. 1 taken along line A-A'.

FIG. 2 is a cross-sectional view of an exemplary embodiment of a display panel 10 of the display apparatus 1 of FIG. 1 taken along line A-A'.

Referring to FIG. 2, the display apparatus 1 may include the display panel 10 including a display element, and first and second electronic elements 20 and 30 respectively corresponding to the first and second regions R1 and R2 of the display panel 10. A component(s) such as, for example, an input sensing member for sensing a touch input, an anti-reflection member including a polarizer and a retarder, or a color filter and a black matrix, and a transparent window, may be arranged on the display panel 10.

The display panel 10 may include a main substrate 100, an encapsulation substrate 400A as an encapsulation member that faces the main substrate 100, and a sealing member 450 disposed between the main substrate 100 and the encapsulation substrate 400A.

The main substrate 100 may include, for example, glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The main substrate 100 may have a multi-layered structure including a layer including the aforementioned polymer resin and an inorganic layer. The encapsulation substrate 400A may include, for example, glass or the aforementioned polymer resin.

A thin-film transistor TFT, an organic light-emitting diode OLED as a display element connected to the thin-film transistor TFT, and signal lines SGL are arranged in the display area DA of the main substrate 100. Signal lines SGL are arranged in the first non-display area NDA1 of the main substrate 100.

Signal lines SGL may provide certain signals (e.g., a data signal and a scan signal) to display elements spaced apart from each other in a Y-axis direction about the first and second regions R1 and R2.

The display panel 10 may include through holes corresponding to the first and second regions R1 and R2. For example, the main substrate 100 and the encapsulation substrate 400A may include through holes 100H and through holes 400AH, respectively. The through holes 100H and 400AH correspond to the first and second regions R1 and R2. Portions of an insulating layer IL or elements disposed between the main substrate 100 and the encapsulation substrate 400A (e.g., the portions corresponding to the first and second regions R1 and R2) may all be removed to form the through holes 100H and 400AH. The through holes 100H may penetrate through (e.g., entirely through) the main substrate 100, and the through holes 400AH may penetrate through (e.g., entirely through) the encapsulation substrate 400A.

FIG. 2 illustrates that sealing members 450 are arranged on both sides of each of the first and second regions R1 and R2. When viewed in a direction perpendicular to a main surface of the main substrate 100, the first and second regions R1 and R2 may be entirely surrounded by the sealing members 450.

The first and second electronic elements 20 and 30 may be located in the first and second regions R1 and R2, respectively. In this case, the first and second electronic elements 20 and 30 may be arranged inside the first and second regions R1 and R2, respectively, or may be arranged on a back surface of the main substrate 100 such that the first and second electronic elements 20 and 30 correspond to the first and second regions R1 and R2, respectively.

The first and second electronic elements 20 and 30 may be electronic elements that use light or sound. For example, an electronic element may be a sensor that receives and uses light, such as an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands such as, for example, visible light, infrared light, and ultraviolet light.

When the display panel 10 includes through holes corresponding to the first and second regions R1 and R2, as shown in FIG. 2, light or sound output or received by the first and second electronic elements 20 and 30 may be more effectively utilized.

Figure 3:
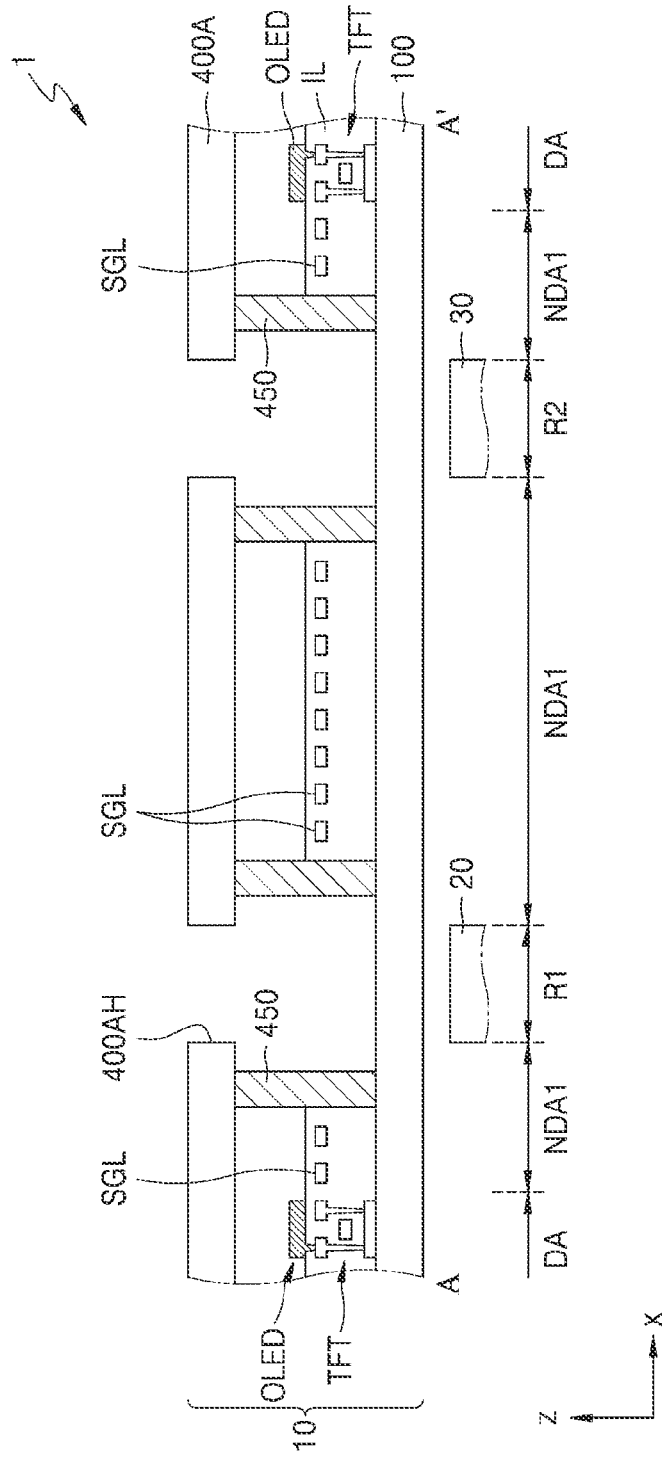
FIG. 3 is a cross-sectional view of an exemplary embodiment of the display panel of the display apparatus of FIG. 1 taken along line A-A'.

FIG. 3 is a cross-sectional view of an exemplary embodiment of the display panel 10 of the display apparatus 1 of FIG. 1 taken along line A-A'.

For convenience of explanation, a further description of elements and technical aspects previously described with reference to FIG. 2 may be omitted.

Referring to FIG. 3, some elements of the display panel 10 do not include through holes. For example, unlike FIG. 2 in which the display panel 10 includes the through holes 100H formed in the main substrate 100 corresponding to the first and second regions R1 and R2, as illustrated in FIG. 3, the encapsulation substrate 400A may include the through holes 400AH corresponding to the first and second regions R1 and R2, but the main substrate 100 may include no through holes. As illustrated in FIG. 3, even though the main substrate 100 includes no through holes, portions of the insulating layer IL or elements disposed between the main substrate 100 and the encapsulation substrate 400A (e.g., the portions corresponding to the first and second regions R1 and R2) may be removed, and thus light transmittance of the first and second electronic elements 20 and 30 may be secured. When the display apparatus 1 includes the display panel 10 of FIG. 3, the first and second electronic elements 20 and 30 may be, for example, electronic elements that use light.

According to an exemplary embodiment, the main substrate 100 may include the through holes 100H as shown in FIG. 2, and the encapsulation substrate 400A may include no through holes. For example, in an exemplary embodiment, the through holes 100H are included in the display panel 1 and the through holes 400AH are not included in the display panel 1. In this case, portions of the insulating layer IL or elements disposed between the main substrate 100 and the encapsulation substrate 400A (e.g., the portions corresponding to the first and second regions R1 and R2) may be removed, and the first and second electronic elements 20 and 30 may be arranged as shown in FIG. 2 or may be arranged to be inserted into the through holes 100H.

Figure 4:
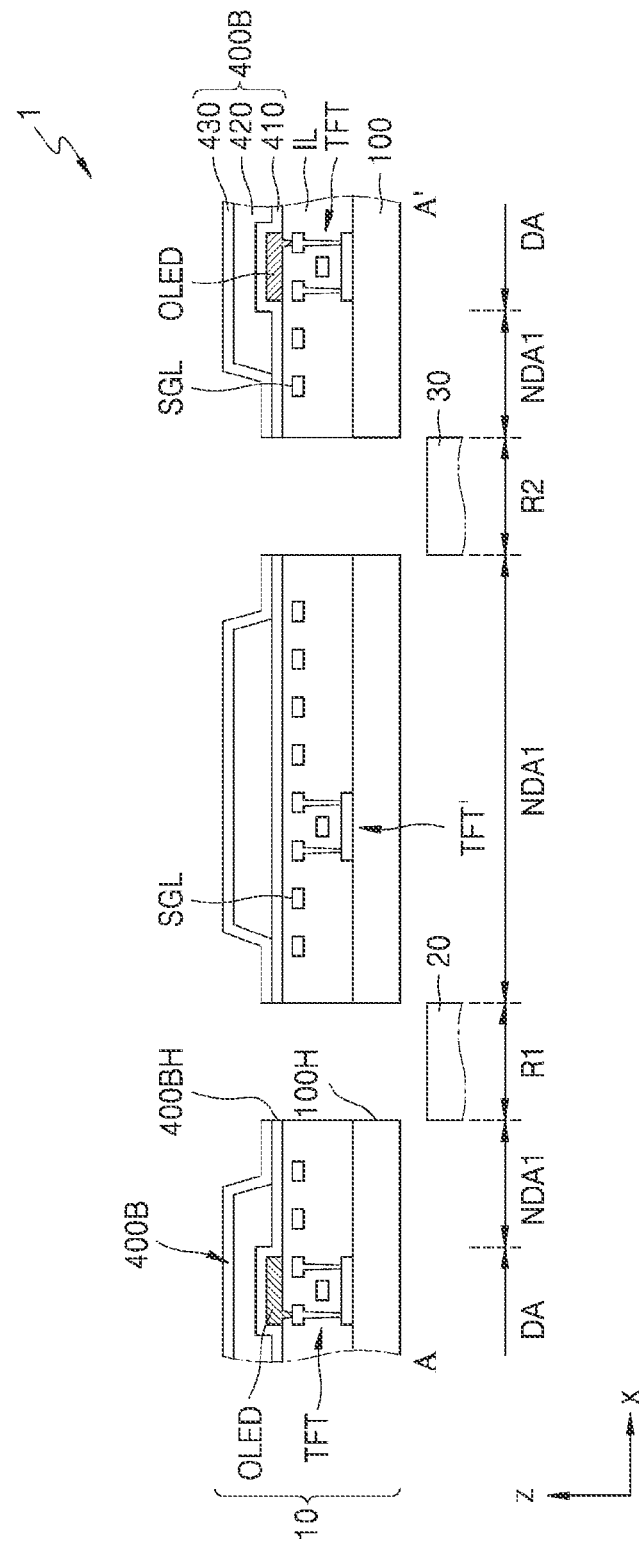
FIG. 4 is a cross-sectional view of an exemplary embodiment of the display panel of the display apparatus of FIG. 1 taken along line A-A'.

FIG. 4 is a cross-sectional view of an exemplary embodiment of the display panel 10 of the display apparatus 1 of FIG. 1 taken along line A-A'.

Referring to FIG. 4, similar to the display apparatus 1 described above with reference to FIG. 2, the display apparatus 1 may include the display panel 10 including a display element, and the first and second electronic elements 20 and 30 respectively corresponding to the first and second regions R1 and R2 of the display panel 10. In an exemplary embodiment, the display apparatus 1 may further include an input detection member for sensing a touch input, a reflection prevention member, a window, etc. . . . arranged on the display panel 10.

Unlike the display panel 10 described above with reference to FIG. 2 that includes the encapsulation substrate 400A as an encapsulation member and the sealing members 450, the display panel 10 according to FIG. 4 may include a thin-film encapsulation layer 400B. Differences therebetween will now be primarily described. For convenience of explanation, a further description of elements and technical aspects previously described with reference to FIGS. 2 and 3 may be omitted.

The thin-film encapsulation layer 400B may include at least one inorganic encapsulation layer and at least one organic encapsulation layer. In this regard, FIG. 4 illustrates first and second inorganic encapsulation layers 410 and 430 and an organic encapsulation layer 420 disposed therebetween.

The first and second inorganic encapsulation layers 410 and 430 may include at least one inorganic insulating material such as, for example, aluminum oxide, titanium oxide, tantalum oxide, hafnium oxide, zinc oxide, silicon oxide, silicon nitride, and silicon oxynitride. The organic encapsulation layer 420 may include, for example, a polymer-based material. Examples of the polymer-based material may include acrylic resin, epoxy-based resin, polyimide, and polyethylene.

The display panel 10 may include through holes corresponding to the first and second regions R1 and R2. For example, the main substrate 100 and the thin-film encapsulation layer 400B may include through holes 100H and through holes 400BH, respectively. The through holes 100H and 400BH correspond to the first and second regions R1 and R2. As described above, the first and second electronic elements 20 and 30 using light or sound may be arranged in the first and second regions R1 and R2, respectively.

When the thin-film encapsulation layer 400B includes the through holes 400BH, each of the at least one inorganic encapsulation layer (e.g., 410 and 430) and the at least one organic encapsulation layer (e.g., 420) may include holes corresponding to the through holes 400BH. In this case, the holes of each organic encapsulation layer are made larger than those of each inorganic encapsulation layer, and thus, the first and second inorganic encapsulation layers 410 and 430 may directly contact each other around the first and second regions R1 and R2. For example, in an exemplary embodiment, the first and second inorganic encapsulation layers 410 and 430 directly contact each other in areas near (e.g., adjacent to) the first and second regions R1 and R2, and do not directly contact each other in areas located further from the first and second regions R1 and R2.

Figure 5:
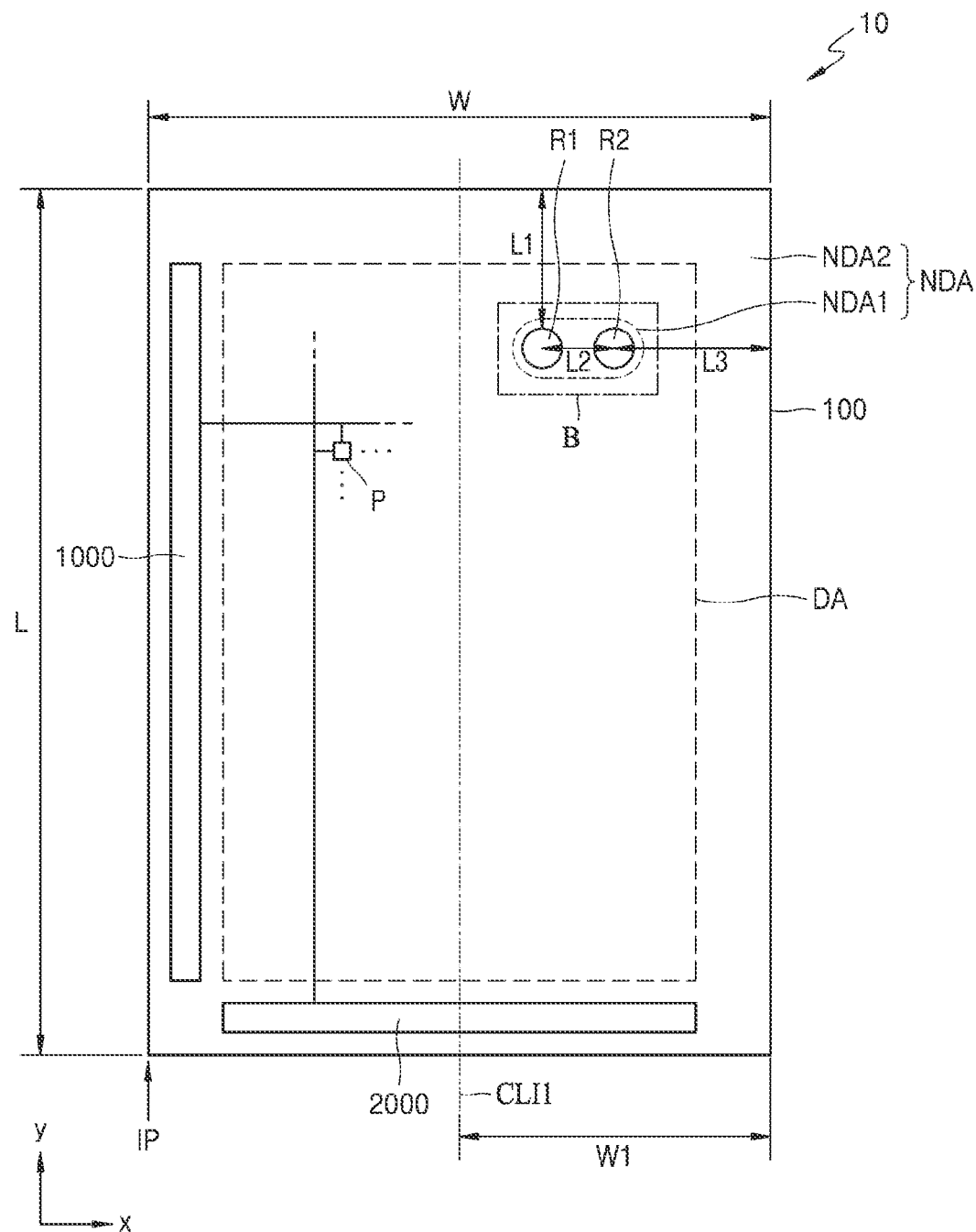
FIG. 5 is a schematic plan view of the display panel of the display apparatus of FIG. 1.
Figure 6:
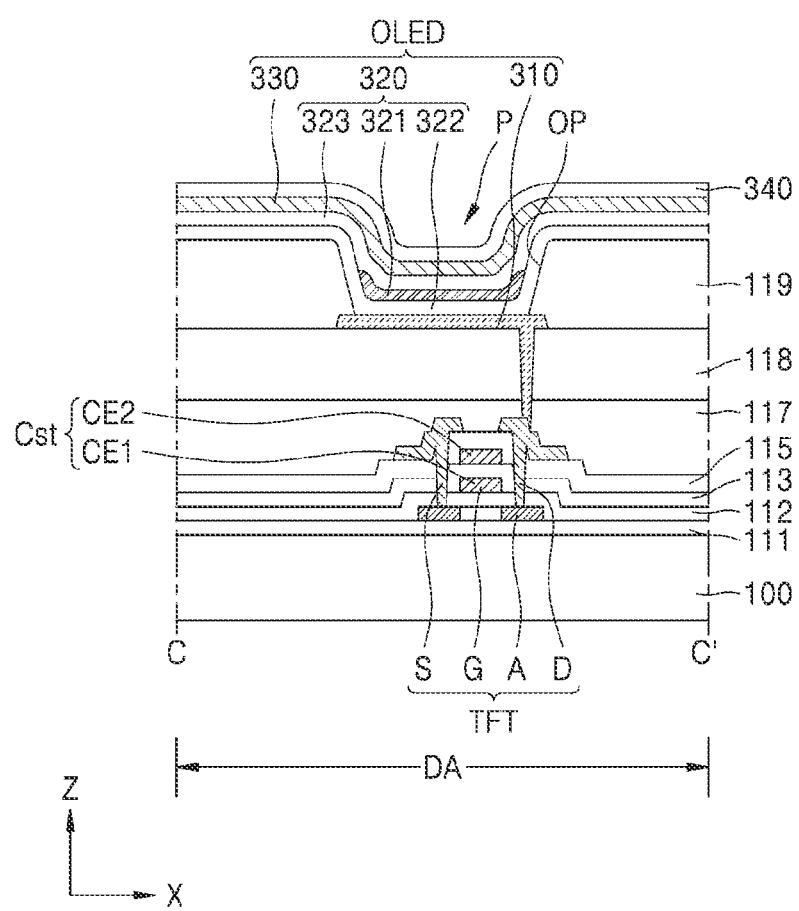
FIG. 6 is a cross-sectional view of a pixel of the display panel of FIG. 5 taken along line C-C' of FIG. 7.
Figure 7:
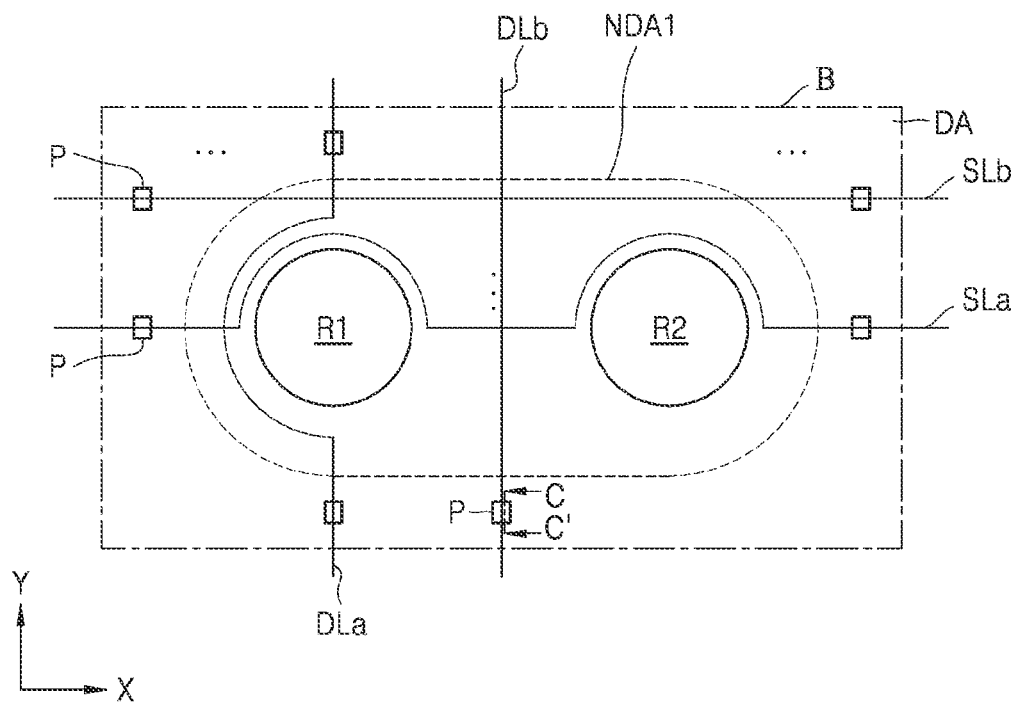
FIG. 7 is a magnified plan view of an exemplary embodiment of region B of FIG. 5.

FIG. 5 is a schematic plan view of the display panel 10 of the display apparatus 1 of FIG. 1. FIG. 6 is a cross-sectional view of a pixel of the display panel 10 of FIG. 5 taken along line C-C' of FIG. 7. FIG. 7 is a magnified plan view of an exemplary embodiment of region B of FIG. 5.

Referring to FIGS. 5 through 7, the display panel 10 includes a plurality of pixels P arranged in the display area DA. Each of the pixels P may include a display element such as, for example, an organic light-emitting diode OLED. The pixel P may emit, for example, red light, green light, blue light, or white light via the organic light-emitting diode OLED. The pixel P may emit one of red light, green light, blue light, and white light as described above. The display area DA may be protected from external air or moisture by being covered by the encapsulation member described above with reference to FIGS. 2 through 4.

The first non-display area NDA1 surrounds both the first and second regions R1 and R2. The first non-display area NDA1 is an area in which no images are displayed. Signal lines that provide signals to the pixels P around the first and second regions R1 and R2 may be arranged in the first non-display area NDA1.

The second non-display area NDA2 may include a scan driver 1000 that provides scan signals to the pixels P, a data driver 2000 that provides data signals to the pixels P, and a main power line for providing a driving voltage and a common voltage.

The first region R1 and the second region R2 are arranged in a first direction, the first non-display area NDA1 surrounds the first region R1 and the second region R2, and the display area DA surrounds the first non-display area NDA1.

The first region R1 and the second region R2 may be circular. A diameter of the first region R1 may be about equal to that of the second region R2. For example, each of the diameters of the first region R1 and the second region R2 may be in the range of about 2 mm to about 5 mm.

The first region R1 and the second region R2 may be located to be eccentric from a first center line CLI1 that passes through respective centers of the shorter edges of a substrate. For example, the first region R1 and the second region R2 may be located at a position other than at the center axis of the display panel 10 corresponding to the first center line CLI1. The center line CLI1 may refer to, for example, an imaginary line that passes through the respective centers of the shorter edges of the substrate. In this case, the first direction may or may not be parallel to a shorter edge of a substrate. In this case, the substrate may include the main substrate 100 and/or an encapsulation substrate. For convenience of description, a case in which the first direction is parallel to each shorter edge of the substrate will now be described in detail.

Herein, the first direction may refer to a direction extending along the X-axis in the figures, and a second direction may refer to a direction extending along the Y-axis in the figures.

A first distance L1, which is a substantially straight-line distance from one of the first region R1 and the second region R2 that is closest to a shorter edge of the substrate to the shorter edge of the substrate, may be about ⅕ or greater of a longer edge of the substrate. The first distance L1 may be, when an arbitrary substantially straight line parallel to the shorter edge of the substrate is drawn on the substrate (e.g., when an arbitrary substantially straight line extends along the X-axis), a minimum distance from a point at which the rim (e.g., the outer edge) of the one of the first region R1 and the second region R2 that is closest to the shorter edge of the substrate meets with the arbitrary substantially straight line to the shorter edge of the substrate. Herein, the rim of the first and second regions R1 and R2 may refer to the outer edge defining the perimeter of the first and second regions R1 and R2, respectively.

In such as case, when at least a portion of one of at least some of the first region R1 and the second region R2 is arranged on a portion of the substrate that is spaced apart from the shorter edge of the substrate by a distance of less than about ⅕ of a longer edge length L of the substrate, and an impact is applied to one corner IP from among the corners of the substrate, stress may be concentrated at the at least portion of the one of the at least some of the first and second regions R1 and R2 arranged on the portion of the substrate that is spaced apart from the shorter edge of the substrate by the distance of less than about ⅕ of the longer edge length L of the substrate, and thus, the substrate may be damaged or destroyed. In this case, a point at which the impact is applied may be a corner of the substrate that is farthest from one of the respective centers of the first and second regions R1 and R2 that is farthest from the first center line CLI1, from among the corners of the substrate.

For example, in such a case, the portion of the substrate that is at about ⅕ of the longer edge length L of the substrate from the shorter edge of the substrate may be a portion of the substrate at which an inflection point of a stress, which is generated at each portion of the substrate, is generated. For example, when an impact is applied to a corner IP of the substrate as described above, stress concentrated on each portion of the substrate may vary according to a distance from the center of the substrate. In this case, an inflection point of a stress depending on a distance may be generated in a portion of the substrate that is a certain distance spaced apart from the center of the substrate, and a variation in the stress depending on a change in the distance may become severe from the inflection point. When the first region R1 and/or the second region R2 is arranged in an area between the inflection point and the shorter edge of the substrate, stress applied to at least a portion of the first region R1 and/or the second region R2 may exceed a preset value. As a result, rim portions of the first region R1 and/or the second region R2 may be damaged due to an impact(s), which may occur during manufacturing or use. For example, a crack(s) may be formed at the outer edge of the first region R1 and/or the second region R2 as a result of an impact(s). Furthermore, when the first region R1 and/or the second region R2 is arranged in the area between the inflection point and the shorter edge of the substrate, the first region R1 and/or the second region R2 may overlap a portion of the substrate at which a maximum stress is generated, and thus, the substrate may be easily damaged or destroyed.

A second distance L2 between the center of the first region R1 and the center of the second region R2 may be about ⅔ or less of a length W of the shorter edge of the substrate. In this case, when the second distance L2 between the center of the first region R1 and the center of the second region R2 exceeds about ⅔ of the length W of the shorter edge of the substrate, the maximum stress of the substrate may overlap the first region R1 and/or the second region R2, and the first region R1 and/or the second region R2 may not be able to have circular shapes.

A third distance L3, which is a shortest distance between a longer edge of the substrate and the center of one of the first and second regions R1 and R2 that is closest to the longer edge of the substrate, may be about ½ or greater of a shortest distance W1 between the first center line CLI1 and the longer edge of the substrate. For example, referring to FIG. 5, the third distance L3 may be about ½ or greater of the shortest distance W1 between the first center line CLI1 and the longer edge of the substrate. The shortest distance W1 may be measured perpendicularly to the longer edge of the substrate.

Thus, the first region R1 and the second region R2 may be arranged within a stress range of a maximum allowable value by being arranged as described above. In addition, by arranging the first region R1 and the second region R2 as described above, it may be possible to secure an area in which a display apparatus and/or the display panel 10 is providable in an external apparatus such as, for example, a case or the like, and the first region R1 and the second region R2 may be prevented from directly receiving forces from the external apparatus or the case.

A plurality of pixels P may be arranged in the display area DA. A plurality of signal lines may be arranged to electrically connect the plurality of pixels P to each other. In this regard, FIG. 7 illustrates that scan lines SLa and SLb each extending in the first direction (X-axis direction) connect pixels P in the display area DA to each other, and data lines DLa and DLb connect pixels P to each other in a second direction (Y-axis direction) intersecting with the first direction. Some scan lines SLa from among the scan lines SLa and SLb may each extend in the first direction (X-axis direction) to provide signals to the pixels P arranged on the left and right sides of the first non-display area NDA1, but may detour around the first region R1 and the second region R2 in the first non-display area NDA1. Some scan lines SLb arranged further from the first region R1 and the second region R2 compared to the scan lines Sla in the first non-display area NDA1, or scan lines that do not traverse the first non-display area NDA1, may each extend in a substantially straight line.

Some data lines DLa from among the data lines DLa and DLb may each extend in the second direction (Y-axis direction) to provide signals to the pixels P arranged on the upper and lower sides of the first non-display area NDA1, but may detour around the first region R1 and the second region R2 in the first non-display area NDA1. Some data lines DLb arranged between the first region R1 and the second region R2 in the first non-display area NDA1, or data lines that do not traverse the first non-display area NDA1, may each extend in a substantially straight line.

For example, when the first region R1 and the second region R2 have circular shapes as described above, signal lines positioned closer to the first region R1 and the second region R2 may curve along the first region R1 and the second region R2, and signal lines positioned further from the first region R1 and the second region R2 may each extend in a substantially straight line.

The pixel P may include a pixel circuit including at least one thin-film transistor TFT, and an organic light-emitting diode OLED as a display element.

The main substrate 100 may include, for example, a glass material, a ceramic material, a metal material, or a polymer resin such as, for example, polyethersulphone, polyacrylate, polyetherimide, polyethylene naphthalate, polyethylene terephthalate, polyphenylene sulfide, polyarylate, polyimide, polycarbonate, or cellulose acetate propionate. The main substrate 100 may have a structure of a single layer or multiple layers of any of the aforementioned materials. The multi-layered structure may further include an inorganic layer. According to exemplary embodiments, the main substrate 100 may have a structure of organic material/inorganic material/organic material.

The main substrate 100 may have a rectangular shape having longer edges opposing each other and shorter edges opposing each other.

A buffer layer 111 may be positioned on the main substrate 100 and may reduce or prevent infiltration of, for example, a foreign material, moisture, or ambient air from the main substrate 100 to the pixel circuit PC, and may provide a flat surface on the main substrate 100. The buffer layer 111 may include an inorganic material (such as, for example oxide or nitride), an organic material, or an organic and inorganic compound, and may be formed as a single layer or multiple layers of an inorganic material and an organic material.

A barrier layer may be further included between the main substrate 100 and the buffer layer 111. The barrier layer may prevent or minimize infiltration of impurities from the main substrate 100 and the like into a semiconductor layer A. The barrier layer may include an inorganic material (such as, for example, oxide or nitride), an organic material, or an organic and inorganic compound, and may be formed as a single layer or multiple layers of an inorganic material and an organic material.

The semiconductor layer A may be arranged on the buffer layer 111. The semiconductor layer A may include, for example, amorphous silicon or polysilicon. According to an exemplary embodiment, the semiconductor layer A may include oxide of at least one of, for example, indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). According to exemplary embodiments, the semiconductor layer A may be formed of Zn oxide, In—Zn oxide, Ga—In—Zn oxide, or the like as a Zn oxide-based material. According to exemplary embodiments, the semiconductor layer A may be an In—Ga—Zn—O (IGZO), In—Sn—Zn—O (ITZO), or In—Ga—Sn—Zn—O (IGTZO) semiconductor containing a metal such as, for example, In, Ga, or Sn, in ZnO. The semiconductor layer A may include a channel region, and a source region and a drain region respectively arranged on both sides of the channel region. The semiconductor layer A may be formed as a single layer or multiple layers.

A gate electrode G is arranged on the semiconductor layer A with a first gate insulating layer 112 disposed therebetween. The gate electrode G at least partially overlaps the semiconductor layer A. The gate electrode G may include, for example, molybdenum (Mo), aluminum (Al), copper (Cu), or titanium (Ti), each of which may include a single layer or multiple layers. For example, the gate electrode G may include a single layer of Mo.

The first gate insulating layer 112 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A second gate insulating layer 113 may cover the gate electrode G. The second gate insulating layer 113 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A first storage capacitor plate CE1 of a storage capacitor Cst may overlap the thin-film transistor TFT. For example, the gate electrode G of the thin-film transistor TFT may function as the first storage capacitor plate CE1 of the storage capacitor Cst.

A second storage capacitor plate CE2 of the storage capacitor Cst overlaps the first storage capacitor plate CE1, with the second gate insulating layer 113 disposed therebetween. In this case, the second gate insulating layer 113 may function as a dielectric layer of the storage capacitor Cst. The second storage capacitor plate CE2 may include a conductive material including, for example, molybdenum (Mo), aluminum (Al), copper (Cu), and titanium (Ti), and may be formed as a multi-layer or single layer including the aforementioned materials. For example, the second storage capacitor plate CE2 may be a single layer of Mo or a multi-layer of Mo/Al/Mo.

Although the storage capacitor Cst overlaps the thin-film transistor TFT in FIG. 6, the disclosure is not limited thereto. For example, in an exemplary embodiment, the storage capacitor Cst does not overlap the thin-film transistor TFT.

An interlayer insulating layer 115 may cover the second storage capacitor plate CE2 of the storage capacitor Cst. The interlayer insulating layer 115 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A source electrode S and a drain electrode D may be arranged on the interlayer insulating layer 115. Each of the source electrode S and the drain electrode D may include a conductive material including, for example, Mo, Al, Cu, and Ti, and may be a multi-layer or single layer including the aforementioned materials. For example, each of the source electrode S and the drain electrode D may be a multi-layer of Ti/Al/Ti.

A via layer 117 and an additional via layer 118 may be positioned on the source electrode S and the drain electrode D, and the organic light-emitting diode OLED may be positioned in a region of the pixel P on the additional via layer 118. According to exemplary embodiments, the additional via layer 118 may be omitted.

The via layer 117 and the additional via layer 118 may have flat upper surfaces such that a pixel electrode 310 may be formed flat. The via layer 117 and the additional via layer 118 may each be formed as a single layer including an organic material, or as multiple layers each including an organic material. The via layer 117 and the additional via layer 118 may include a general-purpose polymer such as, for example, benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The via layer 117 and the additional via layer 118 may include an inorganic material. The via layer 117 and the additional via layer 118 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. When the via layer 117 and the additional via layer 118 include an inorganic material, chemical planarization polishing may be conducted. The via layer 117 may include both an organic material and an inorganic material.

In the display area DA of the main substrate 100, the organic light-emitting diode OLED is positioned on the additional via layer 118. The organic light-emitting diode OLED includes the pixel electrode 310, an intermediate layer 320 including an organic emission layer, and an opposite electrode 330.

A via hole which exposes one of the source electrode S and the drain electrode D of the thin-film transistor TFT is positioned in the via layer 117 and the additional via layer 118, and the pixel electrode 310 contacts the source electrode S or the drain electrode D through the via hole and is electrically connected to the thin-film transistor TFT.

The pixel electrode 310 may be a (semi) light-transmissive electrode or a reflective electrode. According to exemplary embodiments, the pixel electrode 310 may include a reflection layer formed of, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one of, for example, indium tin oxide (ITO), indium zinc oxide (IZO), zinc oxide (ZnO), indium oxide (In2O3), indium gallium oxide (IGO), and aluminum zinc oxide (AZO). According to exemplary embodiments, the pixel electrode 310 may have a stack structure of ITO/Ag/ITO.

A pixel defining layer 119 may be disposed on the additional via layer 118. The pixel defining layer 119 may include openings respectively corresponding to the pixel electrodes 310, for example, openings OP exposing at least center portions of the pixel electrodes 310, in the display area DA, and accordingly define light-emission regions of pixels P. The pixel defining layer 119 may prevent an electric arc or the like from occurring on the edges of the pixel electrodes 310 by increasing distances between the edges of the pixel electrodes 310 and the opposite electrodes 330 disposed on the pixel electrodes 310. The pixel defining layer 119 may be formed of an organic insulating material such as, for example, polyimide, polyamide, acryl resin, benzocyclobutene, hexamethyldisiloxane (HMDSO), or phenol resin, via spin coating or the like.

The pixels P, and more particularly, the light-emission regions of the pixels P, may be defined by the openings OP of the pixel defining layer 119. For example, the edges of the pixels P may mean edges of the openings OP of the pixel defining layer 119. The edges of the openings OP of the pixel defining layer 119 may mean boundaries of the pixel electrodes 310 that are exposed via the openings OP.

The intermediate layer 320 of the organic light-emitting diode OLED may include an organic emission layer 321, and a first common layer 322 and a second common layer 323 that may be respectively disposed on the bottom and top of the organic emission layer 321.

The organic emission layer 321 may include an organic material including a fluorescent or phosphorescent material that emits red, green, blue, or white light. The organic emission layer 321 may include a low-molecular weight organic material or a high-molecular weight organic material.

The first common layer 322 may include a hole injection layer (HIL) and/or a hole transport layer (HTL), and the second common layer 323 may include an electron transport layer (ETL) and/or an electron injection layer (EIL).

The intermediate layer 320 may correspond to each of a plurality of pixel electrodes 310. However, exemplary embodiments are not limited thereto. The intermediate layer 320 may include a single layer extending over the plurality of first electrodes 310, namely, the first common layer 322 and/or the second common layer 323. In exemplary embodiments, the first common layer 322 and/or the second common layer 323 may be omitted.

The opposite electrode 330 may be a light-transmissive electrode or a reflective electrode. According to exemplary embodiments, the opposite electrode 330 may be a transparent or semi-transparent electrode, and may include a metal thin film having a small work function, including, for example, lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including TCO, such as, for example, indium tin oxide (ITO), indium zinc oxide (IZO), zinc oxide (ZnO), or indium oxide ($In_2O_3$), may be further disposed on the metal thin film. The opposite electrode 330 may extend over the display area DA, and may be arranged on the intermediate layer 320 and the pixel defining layer 119. The opposite electrode 330 may be formed as a single body extending over a plurality of organic light-emitting diodes OLEDs, and thus, may correspond to the plurality of pixel electrodes 310.

When the pixel electrode 310 is a reflective electrode and the opposite electrode 330 is a light-transmissive electrode, light emitted by the intermediate layer 320 is emitted toward the opposite electrode 330, and accordingly, the display apparatus 1 may be of a top-emission type. When the pixel electrode 310 is a transparent or semi-transparent electrode and the opposite electrode 330 is a reflective electrode, light emitted by the intermediate layer 320 is emitted toward the main substrate 100, and accordingly, the display apparatus 1 may be of a bottom-emission type. However, the exemplary embodiments are not limited thereto. The display apparatus 1 according to an exemplary embodiment may be of a dual emission type, in which light is emitted toward both the top surface and the bottom surface of the display apparatus 1.

Because the opposite electrode 330 is formed over the entire display panel by using an open mask, the opposite electrode 330 may correspond to the pixel P.

A capping layer 340 may be arranged on the opposite electrode 330. The capping layer 340 may have a lower refractive index than the opposite electrode 330. As a result, luminescent efficiency may be improved by increasing a percentage of light generated by the intermediate layer 320, including the organic emission layer 321, that is totally reflected, and thus, is emitted to the outside of the display panel 10.

For example, the capping layer 340 may include an organic material such as poly(3,4-ethylenedioxythiophene) (PEDOT), 4,4'-bis [N-(3-methylphenyl)-N-phenylamino]biphenyl (TPD), 4,4',4"-tris [(3-methylphenyl)phenylamino] triphenylamine (m-MTDATA), 1,3,5-tris [N,N-bis(2-methylphenyl)-amino]-benzene (o-MTDAB), 1,3,5-tris [N, N-bis (3-methylphenyl)-amino]-benzene (m-MTDAT), 1,3,5-tris [N,N-bis (4-methylphenyl)-amino]-benzene (p-MTDAB), 4,4'-bis [N, N-bis (3-methylphenyl)-amino]-diphenylmethane (BPPM), 4,4'-dicarbazolyl-1,1'-biphenyl (CBP), 4,4',4"-tris(N-carbazole)triphenylamine (TCTA), 2,2',2"-(1,3,5-benzenetolyl)tris-[1-phenyl-1H-benzoimidazole] (TPBI), and 3-(4-biphenyl)-4-phenyl-5-t-butylphenyl-1,2,4-triazole (TAZ).

Alternatively, the capping layer 340 may include an inorganic material such as, for example, zinc oxide, titanium oxide, zirconium oxide, silicon nitride, niobium oxide, tantalum oxide, tin oxide, nickel oxide, indium nitride, or gallium nitride. The materials used to form the capping layer 340 are not limited thereto, and various other materials may be used.

A cover layer may be arranged on the capping layer 340. The cover layer may protect the organic light-emitting diode OLED against damage that may occur during a subsequent process using, for example, plasma or the like. The cover layer may include lithium fluoride (LiF).

As described above, an encapsulation member may be arranged on the organic light-emitting diode OLED.

Figure 8:
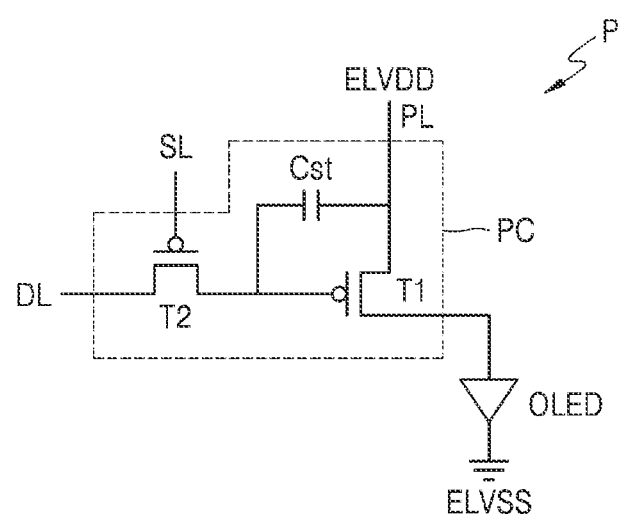
FIGS. 8 and 9 are equivalent circuit diagrams of each pixel of the display panel of FIG. 5.
Figure 9:
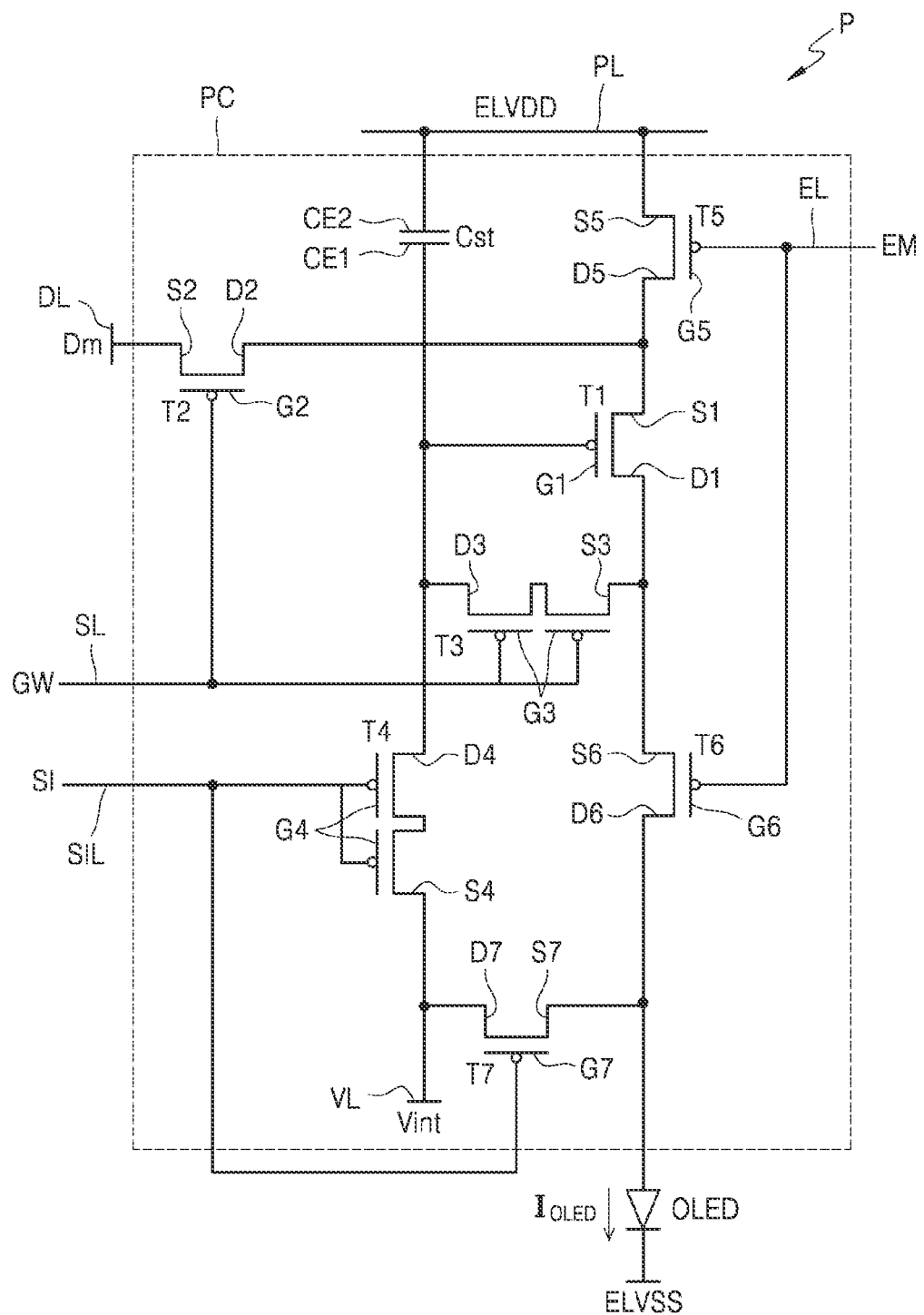

FIGS. 8 and 9 are equivalent circuit diagrams of each pixel P of the display panel 10 of FIG. 5.

Referring to FIGS. 8 and 9, each pixel P includes a pixel circuit PC and an organic light-emitting diode OLED connected to the pixel circuit PC. The pixel circuit PC may include a driving thin-film transistor (TFT) T1, a switching TFT T2, and a storage capacitor Cst.

The switching TFT T2 is connected to a scan line SL and a data line DL, and transmits, to the driving TFT T1, a data voltage received via the data line DL according to a switching voltage received via the scan line SL. The storage capacitor Cst is connected to the switching TFT T2 and a driving voltage line PL, and stores a voltage corresponding to a difference between a voltage received from the switching TFT T2 and a driving voltage ELVDD supplied to the driving voltage line PL.

The driving TFT T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness by the driving current. An opposite electrode (for example, a cathode) of the organic light-emitting diode OLED may receive a common voltage ELVSS.

Although a case in which the pixel circuit PC includes two TFTs and one storage capacitor is illustrated in FIG. 8, the disclosure is not limited thereto. For example, the number of TFTs and the number of storage capacitors may vary according to the design of the pixel circuit PC.

Referring to FIG. 9, the pixel circuit PC may include a plurality of TFTs and a storage capacitor. The TFTs and the storage capacitor may be connected to signal lines SL, SIL, EL, and DL, an initialization voltage line VL, and a driving voltage line PL.

Although each pixel P is connected to the signal lines SL, SIL, EL, and DL, the initialization voltage line VL, and the driving voltage line PL in FIG. 9, the disclosure is not limited thereto. For example, according to an exemplary embodiment, the initialization voltage line VL, the driving voltage line PL, and at least one of the signal lines SL, SIL, EL, and DL may be shared by neighboring pixels.

The plurality of TFTs may include a driving TFT T1, a switching TFT T2, a compensation TFT T3, a first initialization TFT T4, an operation control TFT T5, a light-emission control TFT T6, and a second initialization TFT T7.

The signal lines SL, SIL, EL, and DL may include a scan line SL that transmits a scan signal GW, a previous scan line SIL that transmits a previous scan signal SI to the second initialization TFT T7, a light-emission control line EL that transmits a light-emission control signal EM to the operation control TFT T5 and the light-emission control TFT T6, and a data line DL that intersects with the scan line SL and transmits a data signal Dm. The driving voltage line PL transmits a driving voltage ELVDD to the driving TFT T1, and the initialization voltage line VL transmits an initialization voltage Vint that initiates the driving TFT T1 and a pixel electrode of the organic light-emitting diode OLED.

The driving TFT T1 includes a driving gate electrode G1 connected to a first storage capacitor plate CE1 of the storage capacitor Cst, a driving source electrode S1 connected to the driving voltage line PL via the operation control TFT T5, and a driving drain electrode D1 electrically connected to the pixel electrode of the organic light-emitting diode OLED via the light-emission control TFT T6. The driving TFT T1 receives the data signal Dm according to a switching operation of the switching TFT T2, and supplies a driving current $I_{OLED}$ to the organic light-emitting diode OLED.

The switching TFT T2 includes a switching gate electrode G2 connected to the scan line SL, a switching source electrode S2 connected to the data line DL, and a switching drain electrode D2 connected to the driving source electrode S1 of the driving TFT T1 and also connected to the driving voltage line PL via the operation control TFT T5. The switching TFT T2 is turned on according to the scan signal GW received via the scan line SL, and performs a switching operation of transmitting the data signal Dm received from the data line DL to the driving source electrode S1 of the driving TFT T1.

The compensation TFT T3 includes a compensation gate electrode G3 connected to the scan line SL, a compensation source electrode S3 connected to the driving drain electrode D1 of the driving TFT T1 and also connected to the pixel electrode of the organic light-emitting diode OLED via the light-emission control TFT T6, a compensation drain electrode D3 connected to the first storage capacitor plate CE1 of the storage capacitor Cst, a first initialization drain electrode D4 of the first initialization TFT T4, and the driving gate electrode G1 of the driving TFT T1. The compensation TFT T3 is turned on according to the scan signal GW received via the scan line SL, and electrically connects the driving gate electrode S1 and the driving drain electrode D1 of the driving TFT T1 to each other, such that the driving TFT T1 is diode-connected.

The first initialization TFT T4 includes a first initialization gate electrode G4 connected to the previous scan line SIL, a first initialization source electrode S4 connected to a second initialization drain electrode D7 of the second initialization TFT T7 and the initialization voltage line VL, and the first initialization drain electrode D4 connected to the first storage capacitor plate CE1 of the storage capacitor Cst, the compensation drain electrode D3 of the compensation TFT T3, and the driving gate electrode G1 of the driving TFT T1. The first initialization TFT T4 is turned on according to the previous scan signal SI received via the previous scan line SIL, and transmits the initialization voltage Vint to the driving gate electrode G1 of the driving TFT T1 to thereby initialize a voltage of the driving gate electrode G1 of the driving TFT T1.

The operation control TFT T5 includes an operation control gate electrode G5 connected to the light-emission control line EL, an operation control source electrode S5 connected to the driving voltage line PL, and an operation control drain electrode D5 connected to the driving source electrode S1 of the driving TFT T1 and the switching drain electrode D2 of the switching TFT T2.

The light-emission control TFT T6 includes a light-emission control gate electrode G6 connected to the light-emission control line EL, a light-emission control source electrode S6 connected to the driving drain electrode D1 of the driving TFT T1 and the compensation source electrode S3 of the compensation TFT T3, and a light-emission control drain electrode D6 electrically connected to a second initialization source electrode S7 of the second initialization TFT T7 and the pixel electrode of the organic light-emitting diode OLED.

The operation control TFT T5 and the light-emission control TFT T6 are simultaneously turned on according to the light-emission control signal EM received via the light-emission control line EL. Thus, the driving voltage ELVDD is transmitted to the organic light-emitting diode OLED such that the driving current $I_{OLED}$ may flow in the organic light-emitting diode OLED.

The second initialization TFT T7 includes a second initialization gate electrode G7 connected to the previous scan line SIL, the second initialization source electrode S7 connected to the light-emission control drain electrode D6 of the light-emission control TFT T6 and the pixel electrode of the organic light-emitting diode OLED, and the second initialization drain electrode D7 connected to the first initialization source electrode S4 of the first initialization TFT T4 and the initialization voltage line VL. The second initialization TFT T7 is turned on according to the previous scan signal SI received via the previous scan line SIL, and initializes the pixel electrode of the organic light-emitting device OLED.

Although the first initialization TFT T4 and the second initialization TFT T7 are connected to the previous scan line SIL in FIG. 9, the disclosure is not limited thereto. For example, according to an exemplary embodiment, the first initialization TFT T4 may be connected to the previous scan line SIL and operate according to the previous scan signal SI, and the second initialization TFT T7 may be connected to a separate signal line (for example, a subsequent scan line) and operate according to a signal transmitted to the separate signal line.

A second storage capacitor plate CE2 of the storage capacitor Cst is connected to the driving voltage line PL, and an opposite electrode of the organic light-emitting diode OLED is connected to the common voltage ELVSS. Accordingly, the organic light-emitting diode OLED may receive the driving current $I_{OLED}$ from the driving TFT T1 and emit light, thereby displaying an image.

Although each of the compensation TFT T3 and the first initialization TFT T4 has a dual gate electrode in FIG. 9, exemplary embodiments are not limited thereto. For example, in an exemplary embodiment, each of the compensation TFT T3 and the first initialization TFT T4 may have a single gate electrode.

Figure 10:
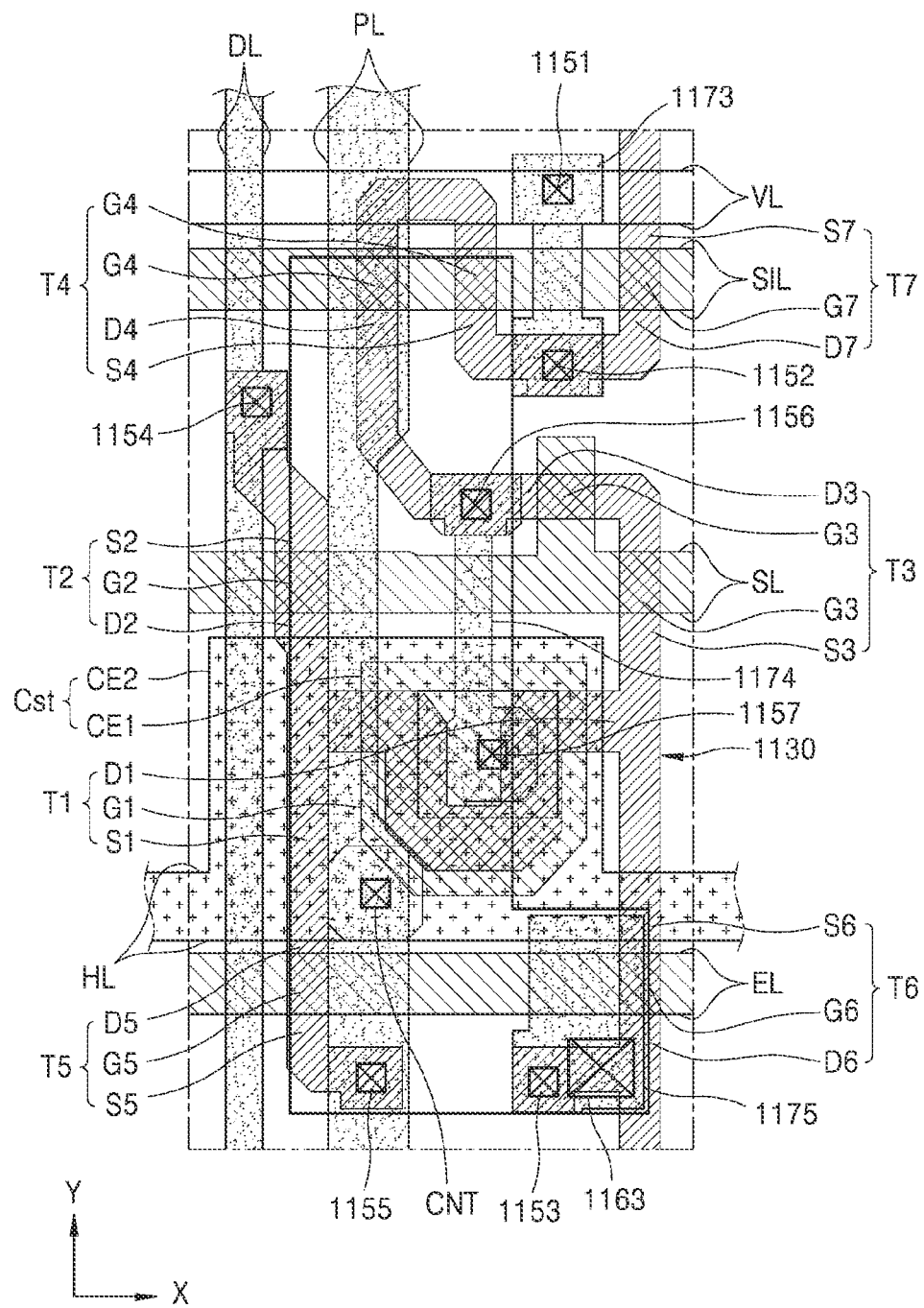
FIG. 10 is a plan layout view of a pixel circuit of the display panel of FIG. 5.

FIG. 10 is a planar layout view of a pixel circuit PC of the display panel 10 of FIG. 5.

Referring to FIG. 10, the driving TFT T1, the switching TFT T2, the compensation TFT T3, the first initialization TFT T4, the operation control TFT T5, the light-emission control TFT T6, and the second initialization TFT T7 are arranged along a semiconductor layer 1130. The semiconductor layer 1130 is arranged on a substrate on which a buffer layer including an inorganic insulating material is arranged.

Some regions of the semiconductor layer 1130 correspond to semiconductor layers of the driving TFT T1, the switching TFT T2, the compensation TFT T3, the first initialization TFT T4, the operation control TFT T5, the light-emission control TFT T6, and the second initialization TFT T7. For example, the semiconductor layers of the driving TFT T1, the switching TFT T2, the compensation TFT T3, the first initialization TFT T4, the operation control TFT T5, the light-emission control TFT T6, and the second initialization TFT T7 may be connected to each other and bent in various shapes.

The semiconductor layer 1130 includes a channel region, and a source region and a drain region disposed on two opposite sides of the channel region. The source region and the drain region may be a source electrode and a drain electrode of the relevant TFT. Hereinafter, for convenience of description, the source region and the drain region are respectively referred to as a source electrode and a drain electrode.

The driving TFT T1 includes the driving gate electrode G1 that overlaps a driving channel region, and the driving source electrode S1 and the driving drain electrode D1 disposed on two opposite sides of the driving channel region. The driving channel region that overlaps the driving gate electrode G1 may form a long channel within a narrow space by having a bent shape such as, for example, an omega shape. When the driving channel region is long, a driving range of a gate voltage is widened. As a result, a gray scale of light emitted from the organic light-emitting diode OLED may be more elaborately controlled and display quality may be improved.

The switching TFT T2 includes the switching gate electrode G2 that overlaps a switching channel region, and the switching source electrode S2 and the switching drain electrode D2 disposed on two opposite sides of the switching channel region. The switching drain electrode D2 may be connected to the driving source electrode S1.

The compensation TFT T3 is a dual TFT, and thus may include compensation gate electrodes G3 that respectively overlap two compensation channel regions, and include the compensation source electrode S3 and the compensation drain electrode D3 arranged on two opposite sides of the compensation channel regions. The compensation TFT T3 may be connected to the driving gate electrode G1 of the driving TFT T1 through a node connection line 1174 which will be described later.

The first initialization TFT T4 is a dual TFT, and thus may include first initialization gate electrodes G4 that respectively overlap two first initialization channel regions, and include the first initialization source electrode S4 and the first initialization drain electrode D4 arranged on two opposite sides of the first initialization channel regions.

The operation control TFT T5 may include the operation control gate electrode G5 that overlaps an operation control channel region, and the operation control source electrode S5 and the operation control drain electrode D5 arranged on two opposite sides of the operation control channel region. The operation control drain electrode D5 may be connected to the driving source electrode S1.

The light-emission control TFT T6 may include the light-emission control gate electrode G6 that overlaps a light-emission control channel region, and the light-emission control source electrode S6 and the light-emission control drain electrode D6 arranged on two opposite sides of the light-emission control channel region. The light-emission control source electrode S6 may be connected to the driving drain electrode D1.

The second initialization TFT T7 may include the second initialization gate electrode G7 that overlaps a second initialization channel region, and the second initialization source electrode S7 and the second initialization drain electrode D7 arranged on two opposite sides of the second initialization channel region.

The aforementioned TFTs may be connected to the signal lines SL, SIL, EL, and DL, the initialization voltage line VL, and the driving voltage line PL.

The scan line SL, the previous scan line SIL, the light-emission control line EL, and the driving gate electrode G1 may be arranged on the semiconductor layer 1130 with an insulating layer(s) arranged therebetween.

The scan line SL may extend in the first direction. Some regions of the scan line SL may correspond to the switching and compensation gate electrodes G4 and G7. For example, regions of the scan line SL that overlap the respective channel regions of the first and second initialization TFTs T4 and T7 may be the first and second initialization gate electrodes G4 and G7, respectively.

The previous scan line SIL may extend in the first direction (e.g., along the X—), and some regions thereof may respectively correspond to the first and second initialization gate electrodes G4 and G7. For example, regions of the previous scan line SIL that overlap the respective channel regions of the first and second initialization TFTs T4 and T7 may be the first and second initialization gate electrodes G4 and G7, respectively.

The light-emission control line EL may extend in the first direction. Some regions of the light-emission control line EL may correspond to the operation control and light-emission control gate electrodes G5 and G6, respectively. For example, regions of the light-emission control line EL that overlap the respective channel regions of the operation control and light-emission control TFTs T6 and T7 may be the operation control and light-emission control gate electrodes G5 and G6, respectively.

The driving gate electrode G1 is a floating electrode, and thus may be electrically connected to the compensation TFT T3 through the above-described node connection line 1174.

An electrode voltage line HL may be arranged on the scan line SL, the previous scan line SIL, the light-emission control line EL, and the driving gate electrode G1 with an insulating layer(s) disposed therebetween.

The electrode voltage line HL may extend in the first direction to intersect with the data line DL and the driving voltage line PL. A portion of the electrode voltage line HL may cover at least a portion of the driving gate electrode G1 and form the storage capacitor Cst together with the driving gate electrode G1. For example, the driving gate electrode G1 may serve as the first storage capacitor plate CE1 of the storage capacitor Cst, and a portion of the electrode voltage line HL may serve as the second storage capacitor plate CE2 of the storage capacitor Cst.

The second storage capacitor plate CE2 of the storage capacitor Cst is electrically connected to the driving voltage line PL. In this regard, the electrode voltage line HL may be connected to the driving voltage line PL arranged on the electrode voltage line HL through a contact hole CNT. Therefore, the electrode voltage line HL may have the same voltage level (e.g., a constant voltage) as the driving voltage line PL. For example, the electrode voltage line HL may have a constant voltage of about 5 V. The electrode voltage line HL may be a transverse driving voltage line.

Because the driving voltage line PL extends in the second direction and the electrode voltage line HL electrically connected to the driving voltage line PL extends in the first direction that intersects with the second direction, a plurality of driving voltage lines PL and a plurality of electrode voltage lines HL may constitute a mesh structure in the display area DA.

According to an exemplary embodiment, the electrode voltage line HL may be arranged on a different layer than the layer on which the driving voltage line PL is arranged, and the electrode voltage line HL may have a greater specific resistivity than the driving voltage line PL.

The data line DL, the driving voltage line PL, an initialization connection line 1173, and the node connection line 1174 may be arranged on the electrode voltage line HL with an insulating layer(s) disposed therebetween.

The data line DL may extend in the second direction and may be connected to the switching source electrode S2 of the switching TFT T2 through a contact hole 1154. A portion of the data line DL may be understood as the switching source electrode S2.

The driving voltage line PL extends in the second direction and is connected to the electrode voltage line HL through the contact hole CNT as described above. The driving voltage line PL may also be connected to the operation control TFT T5 through a contact hole 1155. The driving voltage line PL may be connected to the operation control drain electrode D5 through the contact hole 1155.

One end of the initialization connection line 1173 may be connected to the first and second initialization TFTs T4 and T7 through a contact hole 1152, and another end of the initialization connection line 1173 may be connected to the initialization voltage line VL, which will be described below, through a contact hole 1151.

One end of the node connection line 1174 may be connected to the compensation drain electrode D3 through a contact hole 1156, and another end of the node connection line 1174 may be connected to the driving gate electrode G1 through a contact hole 1157.

The initialization voltage line VL may be arranged on the data line DL, the driving voltage line PL, the initialization connection line 1173, and the node connection line 1174 with an insulating layer(s) disposed therebetween.

The initialization voltage line VL extends in the first direction. The initialization voltage line VL may be connected to the first and second initialization TFTs T4 and T7 through the initialization connection line 1173. The initialization voltage line VL may have a constant voltage (e.g. about −2 V).

The initialization voltage line VL may be arranged on the same layer on which the second storage capacitor plate CE2, namely, the electrode voltage line HL, is arranged, and may include the same material as that included in the second storage capacitor plate CE2, namely, the electrode voltage line HL. In the display area DA, the pixel electrode of the organic light-emitting diode OLED may be connected to the light-emission control TFT T6. The pixel electrode may be connected to a connection metal 1175 through a contact hole 1163, and the connection metal 1175 may be connected to the light-emission control drain electrode D6 through a contact hole 1153.

Figure 11:
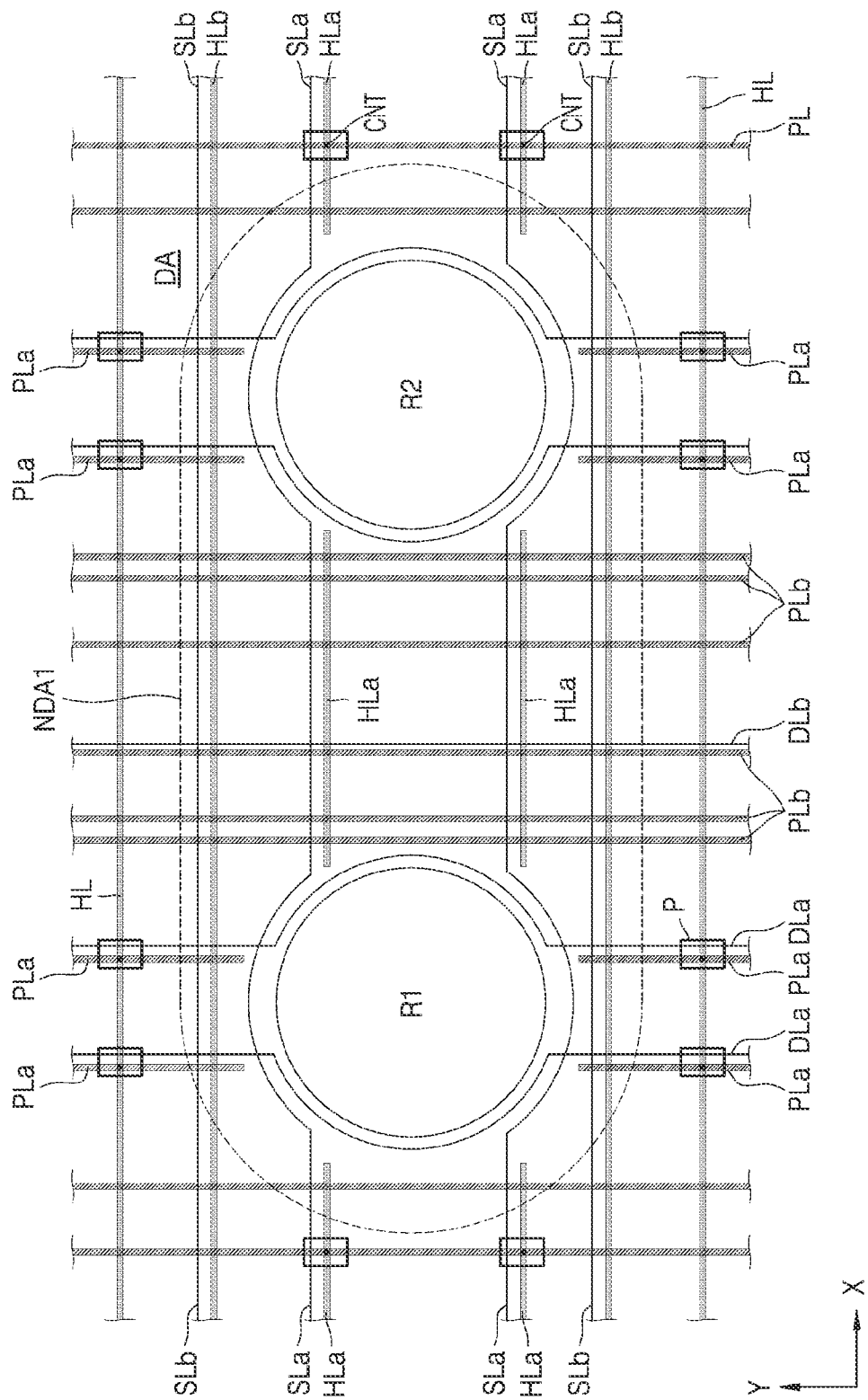
FIG. 11 is a plan view schematically illustrating an arrangement of some of the lines disposed around a first region of the display panel of FIG. 5.

FIG. 11 is a plan view schematically illustrating an arrangement of some of the lines disposed around the first region R1 of the display panel 10 of FIG. 5.

FIG. 11 illustrates some of scan lines SL, data lines DL, driving voltage lines PL, and electrode voltage lines HL arranged around the first region R1. In FIG. 11, for clarity, some wires connected to pixels are not shown.

The scan lines SL may each extend in the first direction, and the data lines DL may each extend in the second direction to intersect with the scan lines SL.

In the first non-display area NDA1, some scan lines SLa may detour around the first region R1. For example, some scan lines SLa may curve along an upper edge of the first region R1, and others may curve along a lower edge of the first region R1. According to an exemplary embodiment, in the first non-display area NDA1, scan lines SLb may each extend in the first direction (X-axis direction) in a substantially straight line without curving along the first region R1. According to an exemplary embodiment, scan lines SLb may be arranged such that they do not pass through the first non-display area NDA1.

In the first non-display area NDA1, some data lines DLa may detour around the first region R1. For example, some data lines DLa may curve along a left edge of the first region R1, and others may curve along a right edge of the first region R1. According to an exemplary embodiment, in the first non-display area NDA1, data lines DLb may each extend in the second direction (Y-axis direction) in a substantially straight line without curving along the first region R1. According to an exemplary embodiment, data lines DLb may be arranged such that they do not pass through the first non-display area NDA1.

Driving voltage lines PLa and PLb may be arranged on the same layer on which the data lines DLa and DLb are arranged, and may be spaced apart from the data lines DLa and DLb. The driving voltage lines PLa and PLb may each extend in the second direction such that the driving voltage lines PLa and PLb intersect with the scan lines SLa and SLb. Some driving voltage lines PLb from among the driving voltage lines PLa and PLb may each continuously extend to traverse the first non-display area NDA1, but driving voltage lines PLa disposed around the first region R1 may be discontinuous around the first region R1. For example, a plurality of driving voltage lines PLa may be arranged apart from each other with the first region R1 disposed therebetween. Similarly, a plurality of driving voltage lines PLa may be arranged apart from each other with the second region R2 disposed therebetween.

Electrode voltage lines HLa and HLb may each extend in the first direction to intersect with the driving voltage lines PLa and PLb. Some electrode voltage lines HLb from among the electrode voltage lines HLa and HLb may each continuously extend to traverse the first non-display area NDA1, but some electrode voltage lines HLa from among the electrode voltage lines HLa and HLb may be discontinuous around the first and second regions R1 and R2. For example, a plurality of electrode voltage lines HLa may be arranged apart from each other with the first region R1 disposed therebetween. Similarly, a plurality of electrode voltage lines HLa may be arranged apart from each other with the second region R2 disposed therebetween.

Because the driving voltage lines PLa and PLb each extend in the second direction, and the electrode voltage lines HLa and HLb electrically connected to the driving voltage lines PLa and PLb each extend in the first direction that intersects the second direction, a plurality of driving voltage lines PLa and PLb and a plurality of electrode voltage lines HLa and HLb disposed between the first and second regions R1 and R2 may constitute a mesh structure.

According to an exemplary embodiment, such driving voltage lines PLa and PLb may be arranged such that they do not pass through the first non-display area NDA1.

Figure 12:
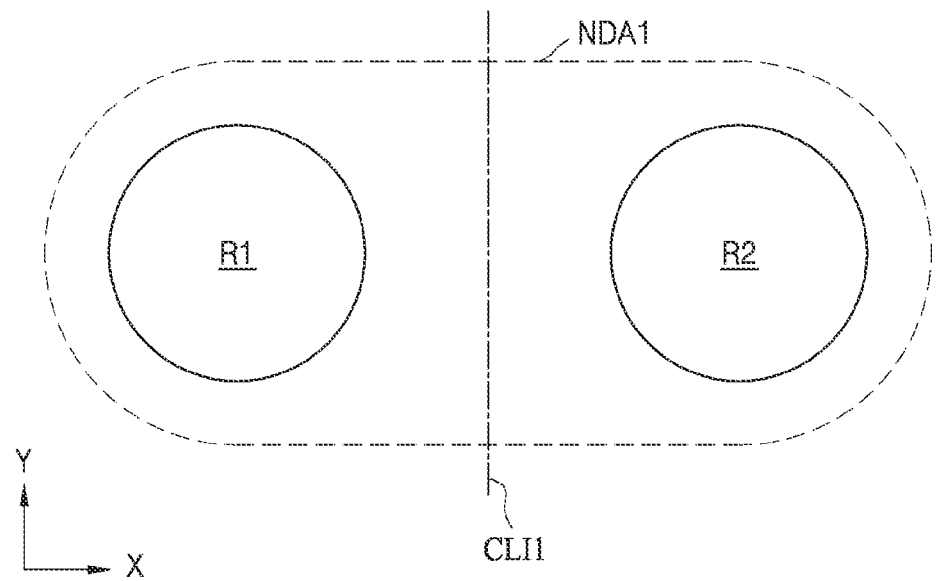
FIG. 12 is a plan view of a portion of a display panel according to an exemplary embodiment.

FIG. 12 is a plan view of a portion of a display panel according to an exemplary embodiment.

Referring to FIG. 12, sizes and/or shapes of a first region R1 and a second region R2 may be about equal to each other. A first non-display area NDA1 arranged around the respective perimeters of the first and second regions R1 and R2 may surround the first region R1 and the second region R2, and may have a shape that is symmetrical with respect to a first center line CLI1 extending in the second direction (Y-axis direction). In this case, the first region R1 and the second region R2 may be arranged to be symmetrical to each other about the first center line CLI1.

The first region R1 and the second region R2 may be arranged at the same locations on the substrate as those described above with reference to FIGS. 5 through 7.

Figure 13:
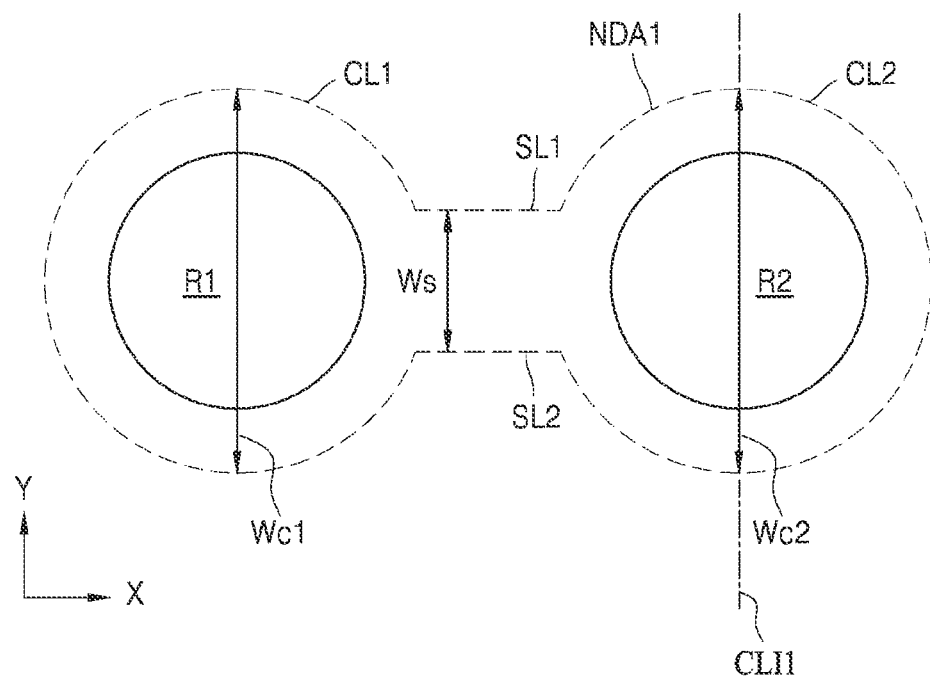
FIG. 13 is a plan view of a display panel according to an exemplary embodiment.

FIG. 13 is a plan view of a display panel according to an exemplary embodiment.

Referring to FIG. 13, a first region R1 and a second region R2 may each have a circular shape, and the diameters of the first region R1 and the second region R2 may be about equal to each other. In this case, one of the first region R1 and the second region R2 may be arranged on the first center line CLI1. For example, the center of one of the first region R1 and the second region R2 may be arranged on the first center line CLI1. The other one of the first region R1 and the second region R2 may be more adjacent to a longer edge of the substrate than the one of the first region R1 and the second region R2 is. For example, the distance between the other one of the first region R1 and the second region R2 and the adjacent longer edge of the substrate may be less than the distance between the one of the first region R1 and the second region R2 and the longer edge of the substrate. The other one of the first region R1 and the second region R2 may be spaced apart from the one of the first region R1 and the second region R2 in the first direction.

The first non-display area NDA1 may surround the first region R1 and the second region R2. In this case, the first region R1 and the second region R2 may be arranged within the first non-display area NDA1.

The outline of the first non-display area NDA1 may include a first curved line CL1 curving along the edge of the first region R1, a second curved line CL2 curving along the edge of the second region R2, and two substantially straight lines SL1 and SL2 which are parallel to each other and connect the curved lines CL1 and CL2 to each other. For example, the first and second curved lines CL1 and CL2 may be disposed around the first region R1 and the second region R2, respectively, and the two substantially straight lines SL1 and SL2 may be disposed between the first region R1 and the second region R2 to connect the first and second curved lines CL1 and CL2 to each other. Accordingly, a width Ws between the two substantially straight lines SL1 and SL2 extending parallel to each other may be made the smallest among the widths of the first non-display area NDA1 in the second direction. For example, the width Ws between the two substantially straight lines SL1 and SL2 may be smaller than each of a width Wc1 between an upper portion of the first curved line CL1 and a lower portion of the first curved line CL1 disposed around the first region R1, and a width Wc2 between an upper portion of the second curved line CL2 and a lower portion of the second curved line CL2 disposed around the second region R2 (Ws<Wc1, Wc2).

The first region R1 and the second region R2 may be arranged at the same locations on the substrate as those described above with reference to FIGS. 5 through 7.

Figure 14:
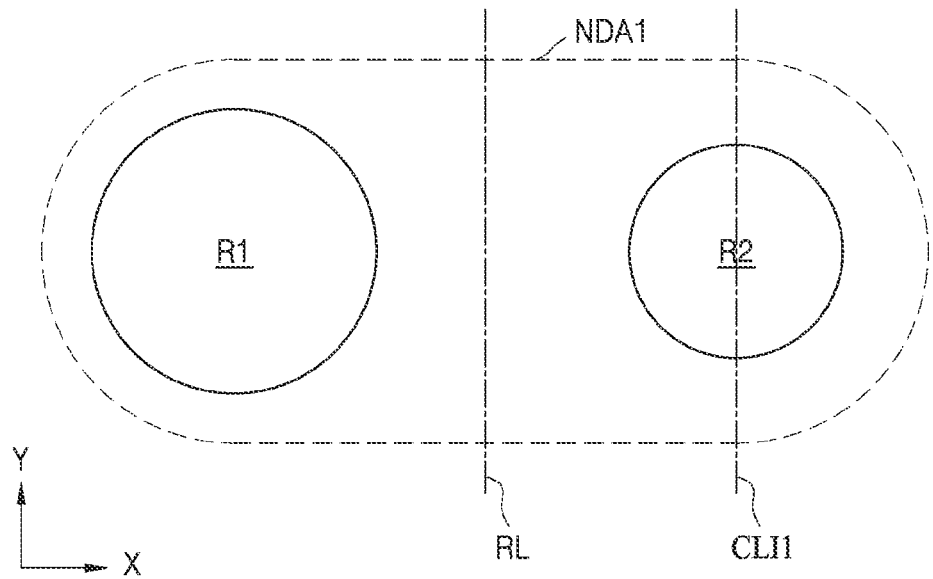
FIG. 14 is a plan view of a portion of a display panel according to an exemplary embodiment.

FIG. 14 is a plan view of a portion of a display panel according to an exemplary embodiment.

Referring to FIG. 14, a first region R1 and a second region R2 may be circular. In this case, a diameter (or radius) of the first region R1 may be different from a diameter (or radius) of the second region R2. For example, the diameter of the first region R1 may be greater than that of the second region R2. In this case, the second region R2 may be arranged on the first center line CLI1. For example, the center of the second region R2 may be arranged on the first center line CLI1. Thus, in an exemplary embodiment, when the first region R1 and the second region R2 have different diameters, the region having the smaller diameter may be disposed such that its center is arranged on the first center line CLI1.

In this case, the first non-display area NDA1 may have various shapes. According to an exemplary embodiment, the first non-display area NDA1 may have a symmetrical shape about a reference line RL that extends between the first region R1 and the second region R2 and extends in the second direction (Y-axis direction).

The first region R1 and the second region R2 may be arranged at the same locations on the substrate as those described above with reference to FIGS. 5 through 7.

For example, a shortest distance from the rim of one of the first region R1 and the second region R2 that is closer to a shorter edge of the substrate to the shorter edge of the substrate may be about ⅕ or greater of the length of a longer edge of the substrate.

A distance from the center of one of the first region R1 and the second region R2 that is closer to a longer edge of the substrate to the longer edge of the substrate may be about ½ or greater of a distance from the first center line CLI1 to the longer edge of the substrate.

Figure 15:
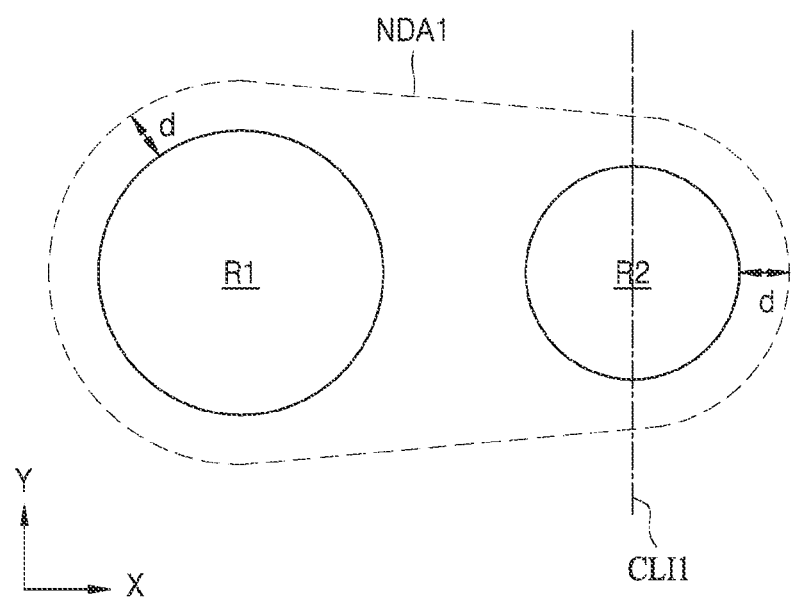
FIG. 15 is a plan view of a portion of a display panel according to another embodiment.

FIG. 15 is a plan view of a portion of a display panel according to an exemplary embodiment.

Referring to FIG. 15, when a first region R1 and a second region R2 are each circular and have different diameters, a first non-display area NDA1 may have an asymmetrical shape.

For example, a left outline of the first non-display area NDA1 may be spaced apart from the first region R1 by a distance of d, and a right outline of the first non-display area NDA1 may be spaced apart from the second region R2 by the distance of d. Accordingly, a width of the first non-display area NDA1 in the second direction may gradually decrease in the first direction.

Such a layout of the first region R1 and the second region R2 may be the same as or similar to that described above with reference to FIG. 14.

Figure 16:
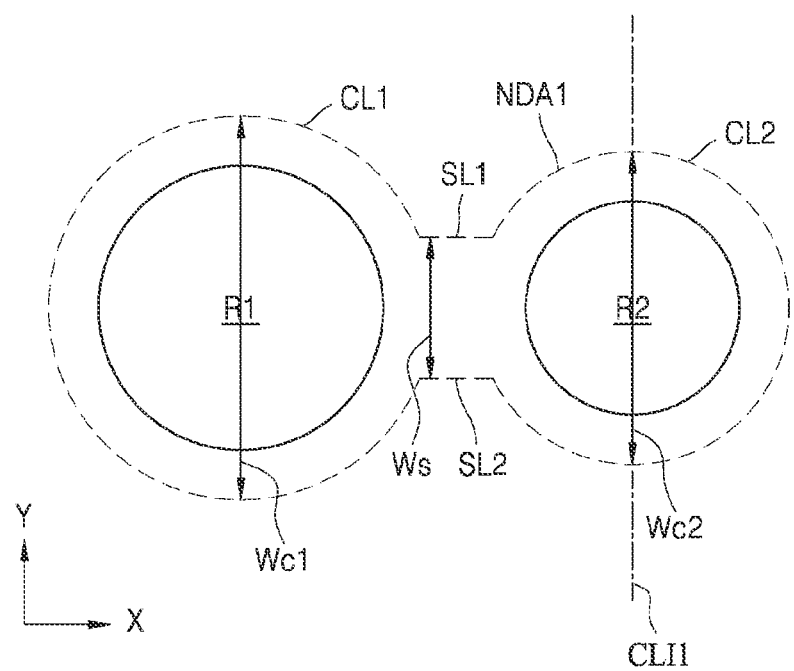
FIG. 16 is a plan view of a portion of a display panel according to an exemplary embodiment.

FIG. 16 is a plan view of a portion of a display panel according to an exemplary embodiment.

Referring to FIG. 16, when a first region R1 and a second region R2 are each circular and have different diameters, a first non-display area NDA1 may have a symmetrical shape.

For example, the outline of the first non-display area NDA1 may include a first curved line CL1 curving along the edge of the first region R1, a second curved line CL2 curving along the edge of the second region R2, and two substantially straight lines SL1 and SL2 which are parallel to each other and connect the curved lines CL1 and CL2 to each other. For example, the first and second curved lines CL1 and CL2 may be disposed around the first region R1 and the second region R2, respectively, and the two substantially straight lines SL1 and SL2 may be disposed between the first region R1 and the second region R2 to connect the first and second curved lines CL1 and CL2 to each other. Accordingly, a width Ws between the two substantially straight lines SL1 and SL2 parallel to each other may be made smallest among the widths of the first non-display area NDA1 in the second direction. For example, the width Ws between the two substantially straight lines SL1 and SL2 may be smaller than each of a width Wc1 between an upper portion of the first curved line CL1 and a lower portion of the first curved line CL1 disposed around the first region R1, and a width Wc2 between an upper portion of the second curved line CL2 and a lower portion of the second curved line CL2 disposed around the second region R2 (Ws<Wc1, Wc2).

Such a layout of the first region R1 and the second region R2 may be the same as or similar to that described above with reference to FIG. 14.

In other cases, the first region R1 and the second region R2 are not arranged on the first center line CLI1. In this case, one of the first region R1 and the second region R2 that has a smaller diameter may be closer to the first center line CLI1 than the other one of the first region R1 and the second region R2 that has a larger diameter. For example, as shown in FIG. 15, a center of the second region R2 may be closer to the first center line CLI1 than a center of the first region R1 is.

In such as case, as described above with reference to FIGS. 5 through 7, when an impact is applied to one of the corners of the substrate, more stress may be concentrated on a rim portion of the second region R2 having a smaller diameter than on the first region R1 having a larger diameter. At this time, generated stress may decrease in a direction toward the center of one of the shorter and longer edges of the substrate.

Accordingly, the second region R2 having more stress concentrated thereon than the first region R1 may be arranged closer to the center of one of the shorter and longer edges of the substrate, and thus, damage to the second region R2 having a smaller diameter due to excessive concentration of stress on the second region R2 may be prevented or reduced.

Figure 17:
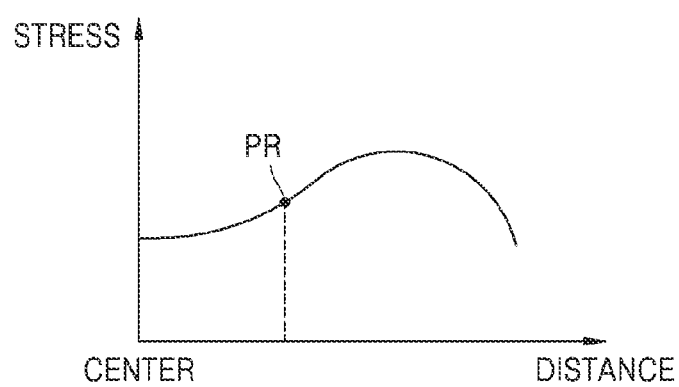
FIG. 17 is a graph showing a relationship between a distance from a center line of the display panel of FIG. 5 and stress when an impact is applied to the display panel of FIG. 5.

FIG. 17 is a graph showing a relationship between a distance from a center line of the display panel of FIG. 5 and stress when an impact is applied to the display panel of FIG. 5.

Referring to FIG. 17, when an impact is applied to one of the corners of the substrate, stress may change in a direction away from the center of one of the longer and shorter edges of the substrate along the one of the longer and shorter edges of the substrate.

For example, in a direction away from the center of a shorter edge of the substrate along the shorter edge of the substrate, stress may increase and then have a maximum value, and may decrease after the maximum value.

In a direction away from the center of a longer edge of the substrate along the longer edge of the substrate, stress may increase and then have a maximum value, and may decrease after the maximum value.

When an impact is applied to one of the corners of the substrate, generated stress may have an inflection point PR in both longer and shorter edge directions of the substrate. The inflection point PR may not be predicted by having a function having different generated stresses. Because the inflection point PR is close to the maximum value of stress, excessive stress may be concentrated on the first region R1 and/or the second region R2 or a portion of the substrate having the maximum stress, and the first region R1 and/or the second region R2 may overlap each other, as described above.

Accordingly, the first region R1 and/or the second region R2 may be arranged such that they do not overlap an area between one of the longer edge of the substrate and the shorter edge of the substrate and the inflection point PR of stress. Thus, damage to the display panel 10 and/or the display apparatus due to application of an external force may be prevented or reduced.

Figure 18:
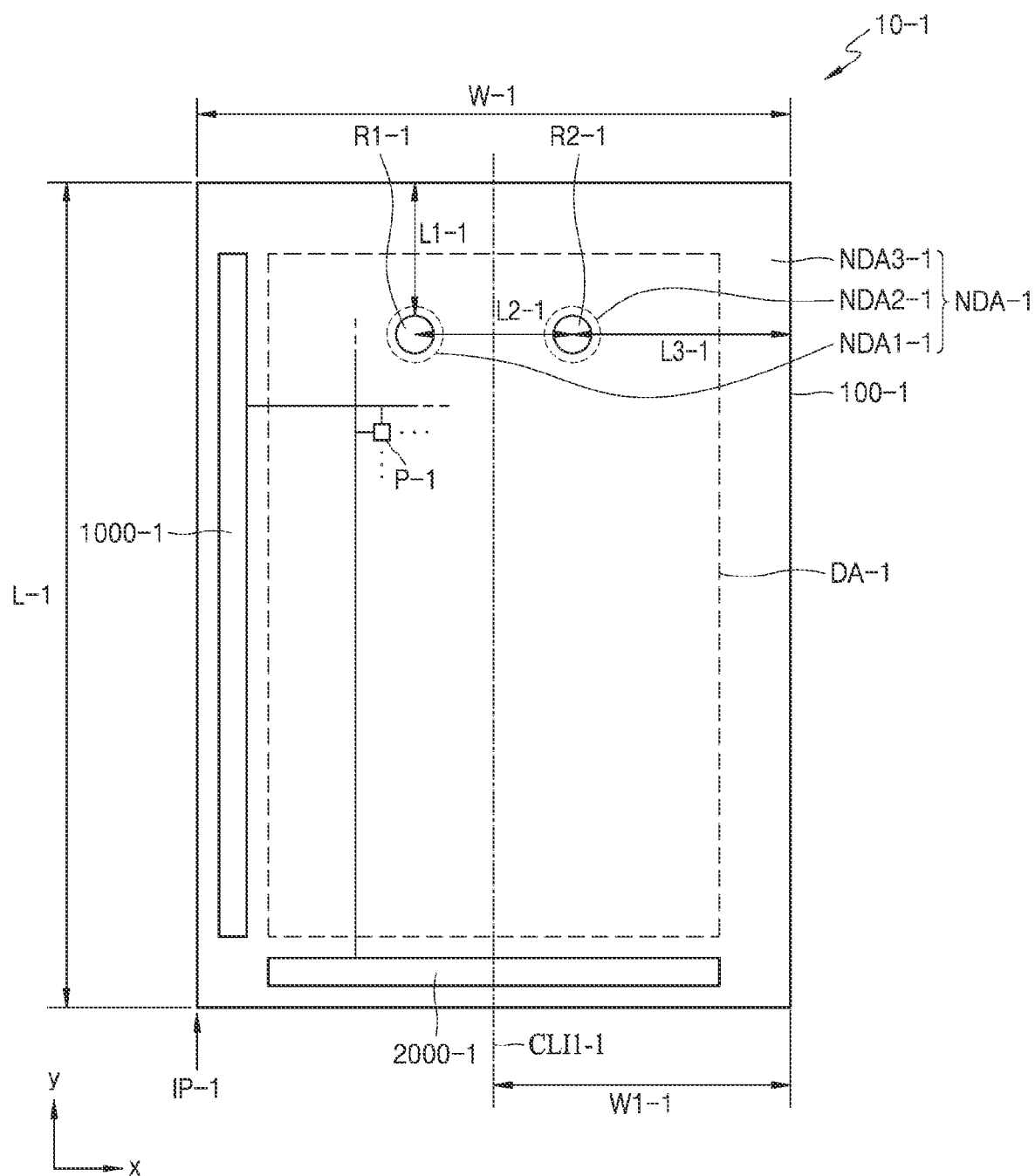
FIG. 18 is a plan view of a display panel of a display apparatus according to an exemplary embodiment.

FIG. 18 is a plan view of a display panel of a display apparatus according to an exemplary embodiment.

Referring to FIG. 18, a display apparatus includes a display area DA-1 that emits light and a non-display area NDA-1 that does not emit light.

The display apparatus may provide an image through the display area DA-1. The display apparatus may include, for example, an LCD, an electrophoretic display, an organic light-emitting diode (OLED) display, an inorganic light-emitting display, a quantum-dot light emitting display, a field emission display, a surface-conduction electron-emitter display, a plasma display, or a cathode ray display.

Although an OLED display apparatus will now be illustrated and described as the display apparatus according to an exemplary embodiment, the disclosure is not limited thereto, and various types of display apparatuses may be used.

Such a display apparatus may include a display panel 10-1 including display elements.

The display panel 10-1 includes a plurality of pixels P-1 arranged in the display area DA-1. Each of the pixels P-1 may include a display element such as, for example, an organic light-emitting diode. The pixel P-1 may emit, for example, red light, green light, blue light, or white light via the organic light-emitting diode. The pixel P-1 used herein may be a pixel that emits one of red light, green light, blue light, and white light as described above. The display area DA-1 may be covered with an encapsulation member, and thus may be protected from, for example, ambient air, moisture, or the like.

The non-display area NDA-1 may include a first non-display area NDA1-1, a second non-display area NDA2-1, and a third non-display area NDA3-1. The first non-display area NDA1-1 surrounds a first region R1-1, and the second non-display area NDA2-1 surrounds a second region R2-1. The first non-display area NDA1-1 and the second non-display area NDA2-1 are areas in which an image is not displayed. Signal lines that provide signals to the pixels P-1 around the first and second regions R1-1 and R2-1 may be arranged in the first non-display area NDA1 and the second non-display area NDA2-1, respectively.

The third non-display area NDA3-1 may include a scan driver 1000-1 that provides scan signals to the pixels P-1, a data driver 2000-1 that provides data signals to the pixels P-1, and a main power line that provides a driving voltage and a common voltage.

The first region R1-1 and the second region R2-1 may be arranged in the first direction. In this case, the first non-display area NDA1-1 and the second non-display area NDA2-1 may be spaced apart from each other, and the display area DA-1 may be located between the first non-display area NDA1-1 and the second non-display area NDA2-1.

The first region R1-1 and the second region R2-1 may be circular. A diameter of the first region R1-1 may be about equal to that of the second region R2-1. For example, each of the diameters of the first region R1-1 and the second region R2-1 may be in the range of about 2 mm to about 5 mm.

The first region R1-1 and the second region R2-1 may be symmetrical to each other about a first center line CLI1-1 that passes through respective centers of the shorter edges of the substrate (the main substrate 100-1 and/or the encapsulation substrate). The first center line CLI1-1 may refer to, for example, an imaginary line that passes through the respective centers of the shorter edges of the substrate. In this case, the first direction may or may not be parallel to the shorter edges of the substrate. For convenience of description, a case in which the first direction is parallel to each shorter edge of the substrate will now be described in detail.

A first distance L1-1, which is a substantially straight-line distance from one of the first region R1-1 and the second region R2-1 that is closest to a shorter edge of the substrate to the shorter edge of the substrate, may be about ⅕ or greater of a longer edge length L-1 of the substrate. The first distance L1-1 may be, when an arbitrary substantially straight line parallel to the shorter edge of the substrate is drawn on the substrate, a minimum distance from a point at which the rim of the one of the first region R1-1 and the second region R2-1 that is closest to the shorter edge of the substrate meets with the arbitrary substantially straight line to the shorter edge of the substrate.

In such as case, when at least a portion of one of at least some of the first region R1-1 and the second region R2-1 is arranged on a portion of the substrate spaced apart from the shorter edge of the substrate by a distance of less than about ⅕ of a longer edge length L-1 of the substrate, and an impact is applied to one corner IP-1 among the corners of the substrate, stress may be concentrated at the at least portion of the one of the at least some of the first and second regions R1 and R2 arranged on the portion of the substrate spaced apart from the shorter edge of the substrate by the distance of less than about ⅕ of the longer edge length L-1 of the substrate, and thus, the substrate may be damaged or destroyed. In this case, a point at which the impact is applied may be a corner of the substrate that is farthest from one of the respective centers of the first and second regions R1-1 and R2-1 that is farthest from the first center line CLI1-1, from among the corners of the substrate.

For example, in such a case, the portion of the substrate that is at about ⅕ of the longer edge length L-1 of the substrate from the shorter edge of the substrate may be a portion of the substrate at which an inflection point of a stress, which is generated at each portion of the substrate, is generated. For example, when an impact is applied to a corner IP-1 of the substrate as described above, stress concentrated on each portion of the substrate may vary according to a distance from the center of the substrate. In this case, an inflection point of a stress depending on a distance may be generated in a portion of the substrate that is a certain distance spaced apart from the center of the substrate, and a variation in the stress depending on a change in the distance may become severe from the inflection point. When the first region R1-1 and/or the second region R2-1 is arranged in an area between the inflection point and the shorter edge of the substrate, stress applied to at least a portion of the first region R1-1 and/or the second region R2-1 may exceed a preset value. As a result, rim portions of the first region R1-1 and/or the second region R2-1 may be damaged due to an impact(s), which may occur during manufacturing or use. For example, a crack(s) may be formed at the outer edge of the first region R1 and/or the second regionR2 as a result of an impact(s). Furthermore, when the first region R1-1 and/or the second region R2-1 is arranged in the area between the inflection point and the shorter edge of the substrate, the first region R1-1 and/or the second region R2-1 may overlap a portion of the substrate at which a maximum stress is generated, and thus, the substrate may be easily damaged or destroyed.

A second distance L2-1 between the center of the first region R1-1 and the center of the second region R2-1 may be about ⅔ or less of a length W-1 of the shorter edge of the substrate. In this case, when the second distance L2-1 between the center of the first region R1-1 and the center of the second region R2-1 exceeds about ⅔ of the length W-1 of the shorter edge of the substrate, the maximum stress of the substrate may overlap the first region R1-1 and/or the second region R2-1, and the first region R1-1 and/or the second region R2-1 may not be able to have circular shapes.

A third distance L3-1, which is a shortest distance between a longer edge of the substrate and the center of one of the first and second regions R1-1 and R2-1 that is closest to the longer edge of the substrate, may be about ½ or greater of a shortest distance W1-1 between the first center line CLI1-1 and the longer edge of the substrate. For example, referring to FIG. 18, the third distance L3-1 may be about ½ or greater of the shortest distance W1-1 between the first center line CLI1-1 and the longer edge of the substrate. The shortest distance W1-1 may be measured perpendicularly to the longer edge of the substrate.

Thus, the first region R1-1 and the second region R2-1 may be arranged within a stress range of a maximum allowable value by being arranged as described above. In addition, by arranging the first region R1-1 and the second region R2-1 as described above, it may be possible to secure an area in which a display apparatus and/or the display panel 10-1 is providable in an external apparatus such as, for example a case or the like, and the first region R1-1 and the second region R2-1 may be prevented from directly receiving forces from the external apparatus or the case.

Figure 19:
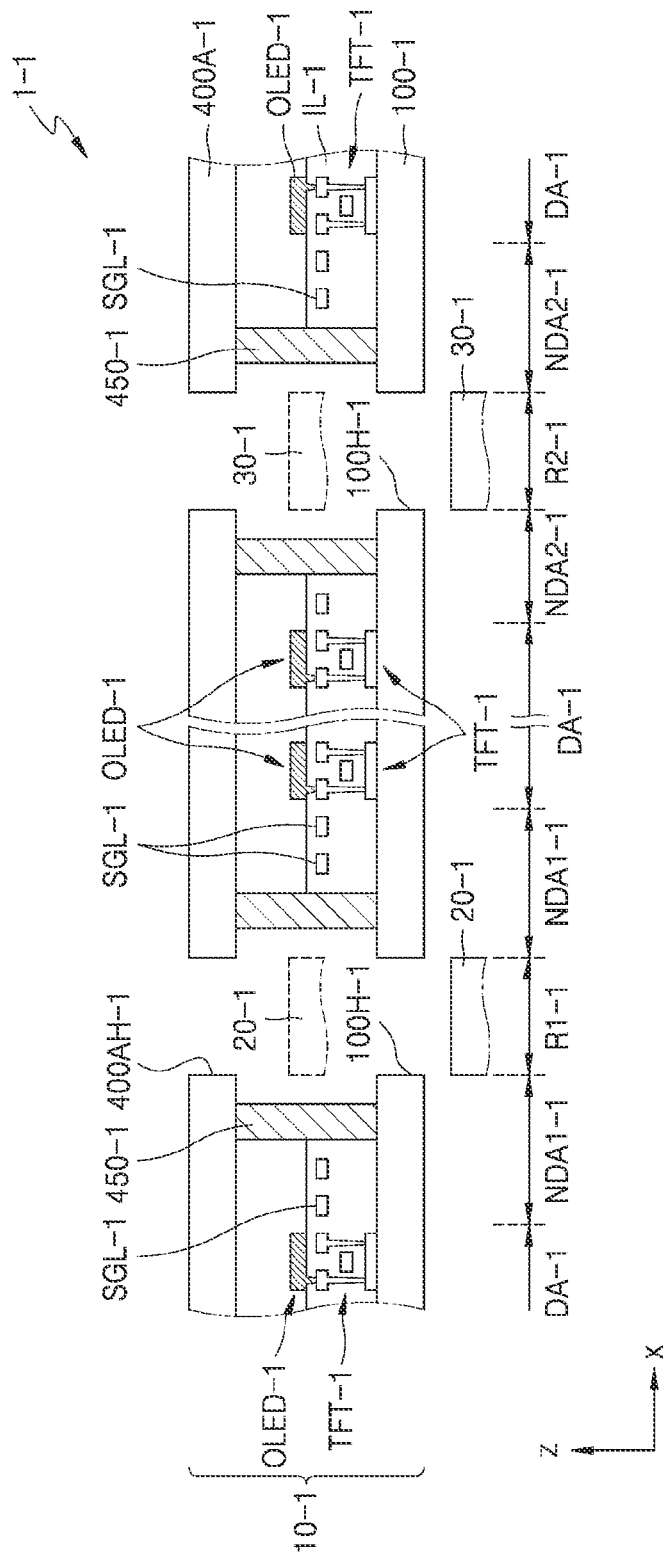
FIG. 19 is a cross-sectional view of an exemplary embodiment of a display apparatus including the display panel of FIG. 18.

FIG. 19 is a cross-sectional view of an exemplary embodiment of a display apparatus 1-1 including the display panel 10-1 of FIG. 18.

Referring to FIG. 19, the display apparatus 1-1 may include the display panel 10-1 including a display element, and first and second electronic elements 20-1 and 30-1 respectively corresponding to the first and second regions R1-1 and R2-1 of the display panel 10-1. A component(s) such as, for example, an input sensing member for sensing a touch input, an anti-reflection member including a polarizer and a retarder, or a color filter and a black matrix, and a transparent window, may be arranged on the display panel 10-1.

The display panel 10-1 may include a main substrate 100-1, an encapsulation substrate 400A-1 as an encapsulation member that faces the main substrate 100-1, and a sealing member 450-1 disposed between the main substrate 100-1 and the encapsulation substrate 400A-1.

The main substrate 100-1 may include, for example, glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The main substrate 100-1 may have a multi-layered structure including a layer including the aforementioned polymer resin and an inorganic layer. The encapsulation substrate 400A-1 may include, for example, glass or the aforementioned polymer resin.

A thin-film transistor TFT-1, an organic light-emitting diode OLED-1 as a display element connected to the thin-film transistor TFT-1, and signal lines SGL-1 are arranged in the display area DA-1 of the main substrate 100-1. Signal lines SGL-1 are arranged in the first and second non-display areas NDA1-1 and NDA2-1 of the main substrate 100-1.

Signal lines SGL-1 may provide certain signals (e.g., a data signal and a scan signal) to display elements spaced apart from each other in the Y-axis direction about the first and second regions R1-1 and R2-2.

The display panel 10-1 may include through holes corresponding to the first and second regions R1-1 and R2-1. For example, the main substrate 100-1 and the encapsulation substrate 400A-1 may include through holes 100H-1 and through holes 400AH-1, respectively. The through holes 100H-1 and 400AH-1 correspond to the first and second regions R1-1 and R2-1. Portions of an insulating layer IL-1 or elements disposed between the main substrate 100-1 and the encapsulation substrate 400A-1 (e.g., the portions corresponding to the first and second regions R1-1 and R2-1) may all be removed to form the through holes 100H-1 and 400AH-1.

FIG. 19 illustrates that sealing members 450-1 are arranged on both sides of each of the first and second regions R1-1 and R2-1. When viewed in a direction perpendicular to a main surface of the main substrate 100-1, the first and second regions R1-1 and R2-1 may be entirely surrounded by the sealing members 450-1.

The first and second electronic elements 20-1 and 30-1 may be located in the first and second regions R1-1 and R2-1, respectively. In this case, the first and second electronic elements 20-1 and 30-1 may be arranged inside the first and second regions R1-1 and R2-1, respectively, or may be arranged on a back surface of the main substrate 100-1 such that the first and second electronic elements 20-1 and 30-1 correspond to the first and second regions R1-1 and R2-1, respectively.

The first and second electronic elements 20-1 and 30-1 may be electronic elements that use light or sound. For example, an electronic element may be a sensor that receives and uses light, such as an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands such as, for example, visible light, infrared light, and ultraviolet light.

When the display panel 10-1 includes through holes corresponding to the first and second regions R1-1 and R2-1, as shown in FIG. 19, light or sound output or received by the first and second electronic elements 20-1 and 30-1 may be more effectively utilized.

Figure 20:
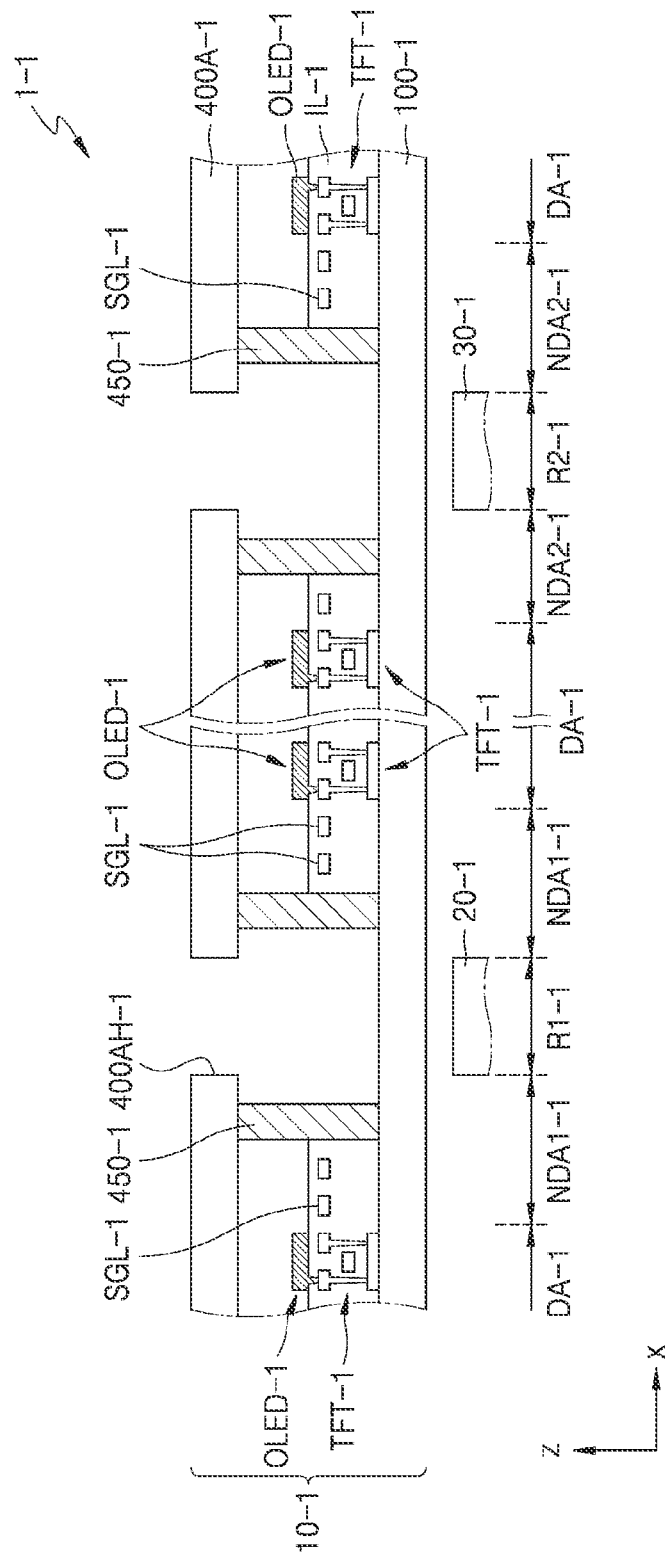
FIG. 20 is a cross-sectional view of an exemplary embodiment of a display apparatus including the display panel of FIG. 18.

FIG. 20 is a cross-sectional view of an exemplary embodiment of the display apparatus 1-1 including the display panel 10-1 of FIG. 18.

Referring to FIG. 20, in an exemplary embodiment, some elements of the display panel 10-1 do not include through holes. For example, unlike FIG. 19 in which the display panel 10-1 includes the through holes 100H-1 formed in the main substrate 100-1 corresponding to the first and second regions R1-1 and R2-1, as illustrated in FIG. 20, the encapsulation substrate 400A-1 may include the through holes 400AH-1 corresponding to the first and second regions R1-1 and R2-1, but the main substrate 100-1 may include no through holes. As illustrated in FIG. 20, even though the main substrate 100-1 does not include the through holes 100H-1, portions of the insulating layer IL-1 or elements disposed between the main substrate 100-1 and the encapsulation substrate 400A-1 (e.g., the portions corresponding to the first and second regions R1-1 and R2-1) may be removed, and thus light transmittance of the first and second electronic elements 20-1 and 30-1 may be secured. When the display apparatus 1-1 includes the display panel 10-1 of FIG. 20, the first and second electronic elements 20-1 and 30-1 may be, for example, electronic elements that use light.

Figure 21:
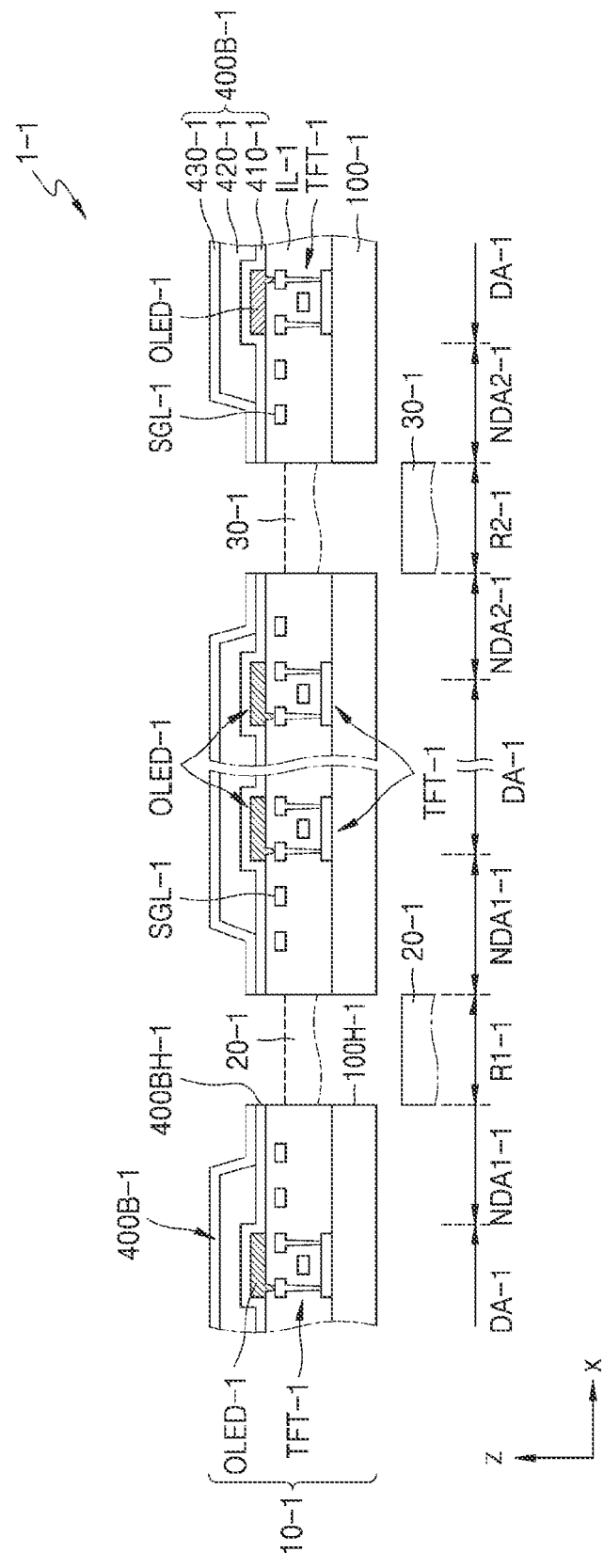
FIG. 21 is a cross-sectional view of an exemplary embodiment of a display apparatus including the display panel of FIG. 18.

FIG. 21 is a cross-sectional view of an exemplary embodiment of the display apparatus 1-1 including the display panel 10-1 of FIG. 18.

Referring to FIG. 21, similar to the display apparatus 1-1 described above with reference to FIG. 19, the display apparatus 1-1 may include the display panel 10-1 including a display element, and the first and second electronic elements 20-1 and 30-1 respectively corresponding to the first and second regions R1-1 and R2-1 of the display panel 10-1. In an exemplary embodiment, the display apparatus 1-1 may further include an input detection member for sensing a touch input, a reflection prevention member, a window, etc. arranged on the display panel 10-1. Unlike the display panel 10-1 described above with reference to FIG. 19 that includes the encapsulation substrate 400A-1 as an encapsulation member and the sealing members 450-1, the display panel 10-1 according to FIG. 21 may include a thin-film encapsulation layer 400B-1. Differences therebetween will now be primarily described. For convenience of explanation, a further description of elements and technical aspects previously described may be omitted.

The thin-film encapsulation layer 400B-1 may include at least one inorganic encapsulation layer and at least one organic encapsulation layer. In this regard, FIG. 21 illustrates first and second inorganic encapsulation layers 410-1 and 430-1 and an organic encapsulation layer 420-1 disposed therebetween.

The first and second inorganic encapsulation layers 410-1 and 430-1 may include at least one inorganic insulating material such as, for example, aluminum oxide, titanium oxide, tantalum oxide, hafnium oxide, zinc oxide, silicon oxide, silicon nitride, and silicon oxynitride. The organic encapsulation layer 420-1 may include, for example, a polymer-based material. Examples of the polymer-based material may include acrylic resin, epoxy-based resin, polyimide, and polyethylene.

The display panel 10-1 may include through holes corresponding to the first and second regions R1-1 and R2-1. For example, the main substrate 100-1 and the thin-film encapsulation layer 400B-1 may include through holes 100H-1 and through holes 400BH-1, respectively. The through holes 100H-1 and 400BH-1 correspond to the first and second regions R1-1 and R2-1. As described above, the first and second electronic elements 20-1 and 30-1 using light or sound may be arranged in the first and second regions R1-1 and R2-1, respectively.

When the thin-film encapsulation layer 400B-1 includes the through holes 400BH-1, each of the at least one inorganic encapsulation layer (e.g., 410-1 and 430-1) and the at least one organic encapsulation layer (e.g., 420-1) may include holes corresponding to the through holes 400BH-1. In this case, the holes of each organic encapsulation layer are made larger than those of each inorganic encapsulation layer, and thus, the first and second inorganic encapsulation layers 410-1 and 430-1 may directly contact each other around the first and second regions R1-1 and R2-1. For example, in an exemplary embodiment, the first and second inorganic encapsulation layers 410-1 and 430-1 directly contact each other in areas near (e.g., adjacent to) the first and second regions R1-1 and R2-1, and do not directly contact each other in areas located further from the first and second regions R1-1 and R2-1.

Figure 22:
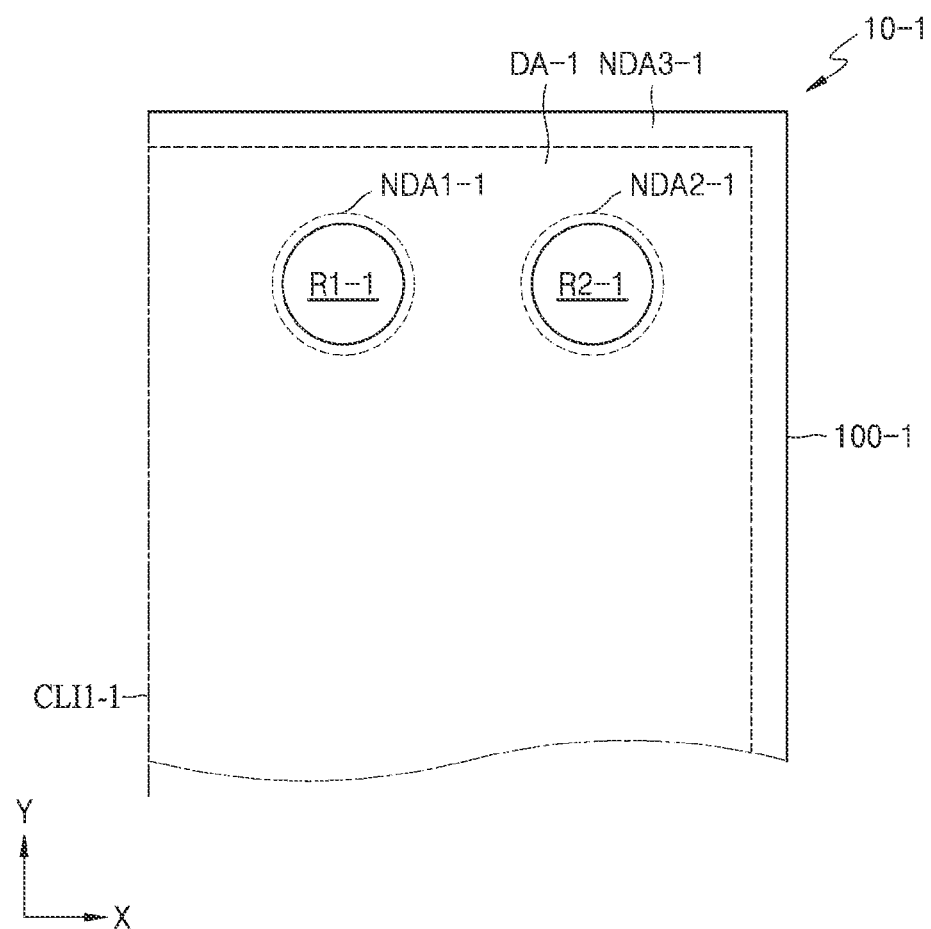
FIG. 22 is a plan view of a display panel of a display apparatus according to an exemplary embodiment.

FIG. 22 is a plan view of a display panel of a display apparatus according to an exemplary embodiment.

Referring to FIG. 22, the first region R1-1 and the second region R2-1 may be located to be eccentric from a first center line CLI1-1 that passes through respective centers of the shorter edges of the substrate (the main substrate 100-1 and/or the encapsulation substrate). For example, the first region R1-1 and the second region R2-1 may be located at a position other than at the center axis of the display panel 10-1 corresponding to the first center line CLI1-1.

The first non-display area NDA1-1 and the second non-display area NDA2-1 may surround the first region R1-1 and the second region R2-1, respectively. The first non-display area NDA1-1 and the second non-display area NDA2-1 may not be connected to each other.

In such a case, the first region R1-1 and the second region R2-1 may be arranged in certain areas of the substrate. The arrangement of the first region R1-1 and the second region R2-1 on the substrate is the same as that described above with reference to FIG. 19, and thus, a detailed description thereof is omitted herein.

Figure 23:
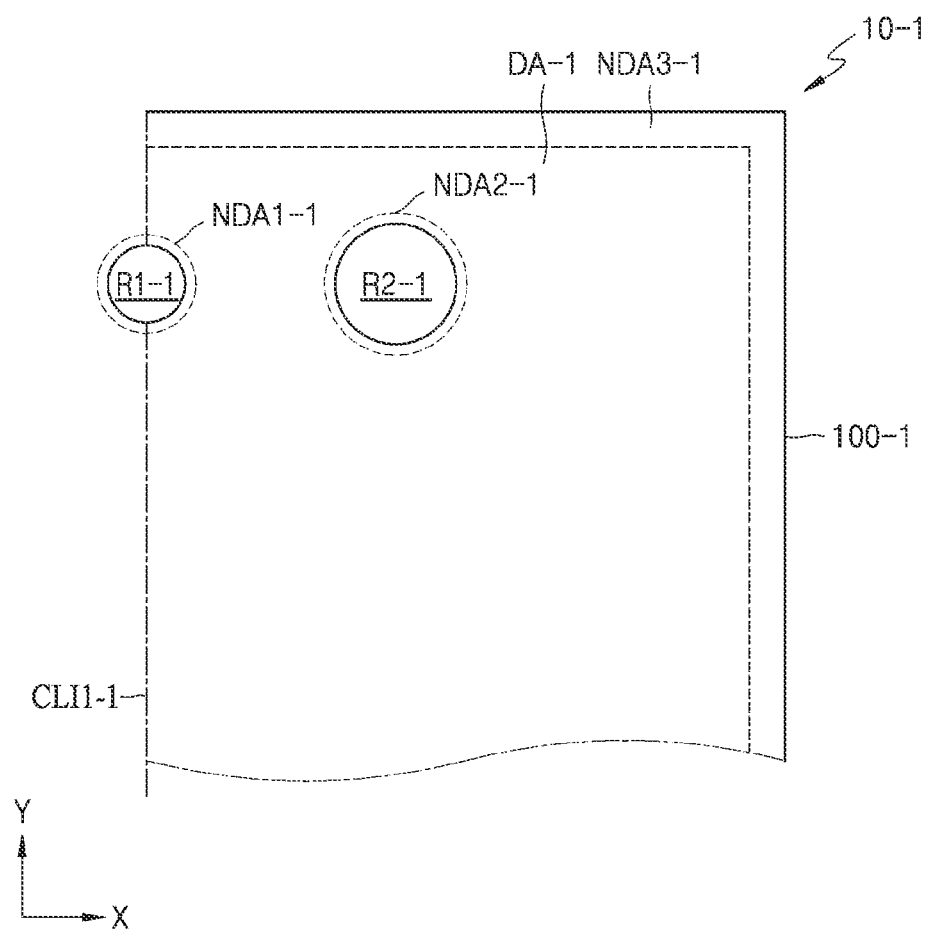
FIG. 23 is a plan view of a display panel of a display apparatus according to an exemplary embodiment.

FIG. 23 is a plan view of a display panel of a display apparatus according to an exemplary embodiment.

Referring to FIG. 23, a first region R1-1 and a second region R2-1 may be circular. In this case, a diameter (or radius) of the first region R1-1 may be different from a diameter (or radius) of the second region R2-1. For example, the diameter of the first region R1-1 may be less than that of the second region R2-1. In this case, the first region R1-1 may be arranged on the first center line CLI1-1. For example, the center of the first region R1-1 may be arranged on the first center line CLI1-1.

The first non-display area NDA1-1 and the second non-display area NDA2-1 may be spaced apart from each other and may surround the first region R1-1 and the second region R2-1, respectively.

The arrangement of the first region R1-1 and the second region R2-1 on a substrate (the main substrate 100-1 and/or encapsulation substrate) is the same as that described above with reference to FIG. 14, and thus, a detailed description thereof is omitted herein.

Figure 24:
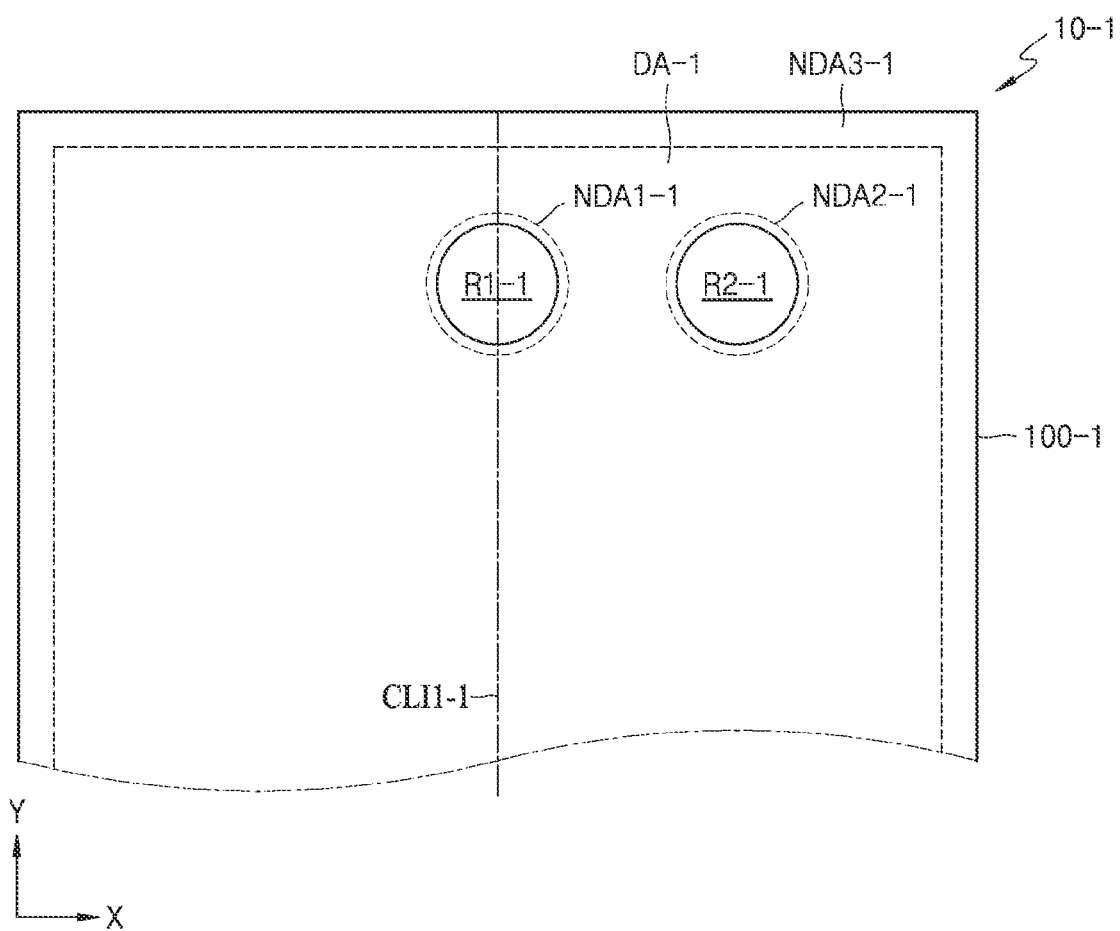
FIG. 24 is a plan view of a display panel of a display apparatus according to an exemplary embodiment.

FIG. 24 is a plan view of a display panel of a display apparatus according to an exemplary embodiment.

Referring to FIG. 24, a first region R1-1 and a second region R2-1 may be circular. In this case, a diameter (or radius) of the first region R1-1 may be about equal to a diameter (or radius) of the second region R2-1. In this case, the first region R1-1 may be arranged on the first center line CLI1-1. For example, the center of the first region R1-1 may be arranged on the first center line CLI1-1.

The first non-display area NDA1-1 and the second non-display area NDA2-1 may be spaced apart from each other and may surround the first region R1-1 and the second region R2-1, respectively.

The arrangement of the first region R1-1 and the second region R2-1 on a substrate (the main substrate 100-1 and/or the encapsulation substrate) is the same as that described above with reference to FIG. 14 or 19, and thus, a detailed description thereof is omitted herein.

Figure 25:
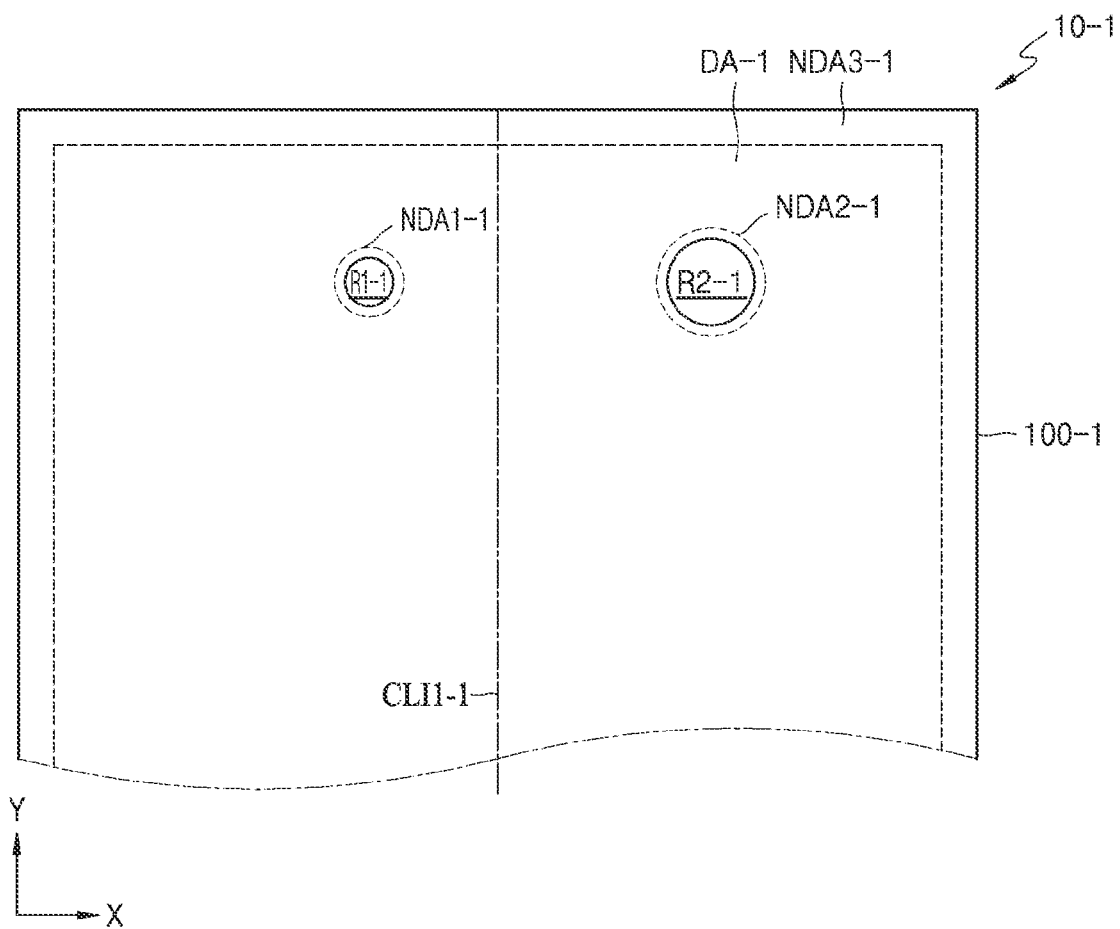
FIG. 25 is a plan view of a display panel of a display apparatus according to an exemplary embodiment.

FIG. 25 is a plan view of a display panel of a display apparatus according to an exemplary embodiment.

Referring to FIG. 25, a first region R1-1 and a second region R2-1 may be circular. In this case, a diameter (or radius) of the first region R1-1 may be different from a diameter (or radius) of the second region R2-1. For example, the diameter of the first region R1-1 may be less than that of the second region R2-1.

The first region R1-1 and the second region R2-1 are not arranged on the first center line CLI1-1. In this case, one of the first region R1-1 and the second region R2-1 that has a smaller diameter may be closer to the first center line CLI1-1 than the other one of the first region R1-1 and the second region R2-1 that has a larger diameter. For example, as shown in FIG. 25, a center of the first region R1-1 may be closer to the first center line CLI1-1 than a center of the second region R2-1 is.

In such as case, as described above with reference to FIGS. 5 through 7, when an impact is applied to one of the corners of a substrate (a main substrate 100-1 and/or an encapsulation substrate), more stress may be concentrated on a rim portion of the first region R1-1 having a smaller diameter than on the second region R2-1 having a larger diameter. At this time, generated stress may decrease in a direction toward the center of one of the shorter and longer edges of the substrate.

Accordingly, the first region R1-1 having more stress concentrated thereon than the second region R2-1 may be arranged close to the center of one of the shorter and longer edges of the substrate (e.g., closer to the center as compared to the second region R2-1), and thus, damage to the first region R1-1 having a smaller diameter due to excessive concentration of stress on the first region R1-1 may be prevented.

The first non-display area NDA1-1 and the second non-display area NDA2-1 may be spaced apart from each other and may surround the first region R1-1 and the second region R2-1, respectively.

The arrangement of the first region R1-1 and the second region R2-1 on the substrate is the same as that described above with reference to FIG. 19, and thus, a detailed description thereof is omitted herein.

Figure 26:
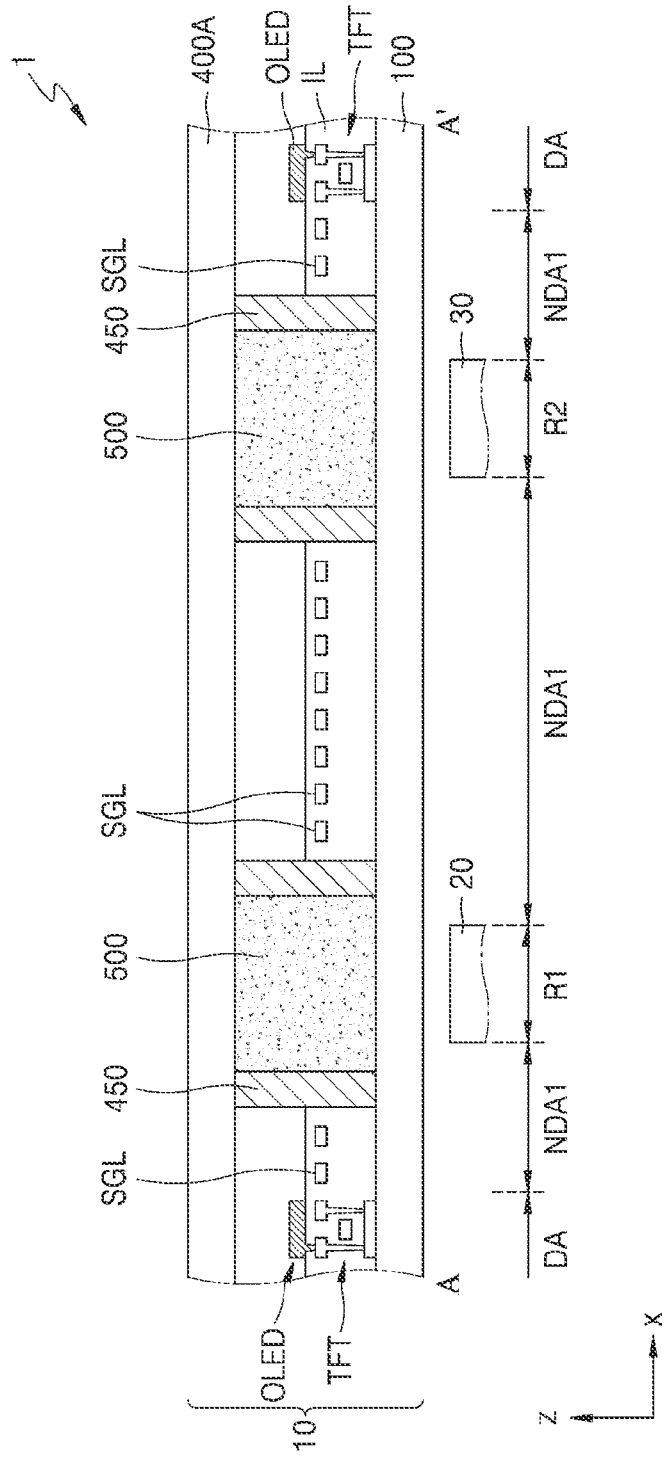
FIG. 26 is a cross-sectional view of an exemplary embodiment of the display panel of the display apparatus of FIG. 1 taken along line A-A'.

FIG. 26 is a cross-sectional view of an exemplary embodiment of the display panel 10 of the display apparatus 1 of FIG. 1 taken along line A-A'.

Referring to FIG. 26, as shown in FIG. 2, the display apparatus 1 may include the display panel 10 including a display element, and first and second electronic elements 20 and 30 respectively corresponding to the first and second regions R1 and R2 of the display panel 10. A component(s) such as, for example, an input sensing member for sensing a touch input, an anti-reflection member including a polarizer and a retarder, or a color filter and a black matrix, and a transparent window, may be arranged on the display panel 10.

In contrast to FIG. 2, no through holes are formed in the first and second regions R1 and R2 of the display panel 10. A transparent material layer 500 may be arranged between the main substrate 100 and the encapsulation substrate 400A in the first and second regions R1 and R2.

The transparent material layer 500 may include a transparent (light-transmitting) material such as, for example, resin (for example, an acryl-based organic material). When the transparent material layer 500 is interposed between the main substrate 100 and the encapsulation substrate 400A, light transmittance may improve more than when air is interposed between the main substrate 100 and the encapsulation substrate 400A.

Figure 27:
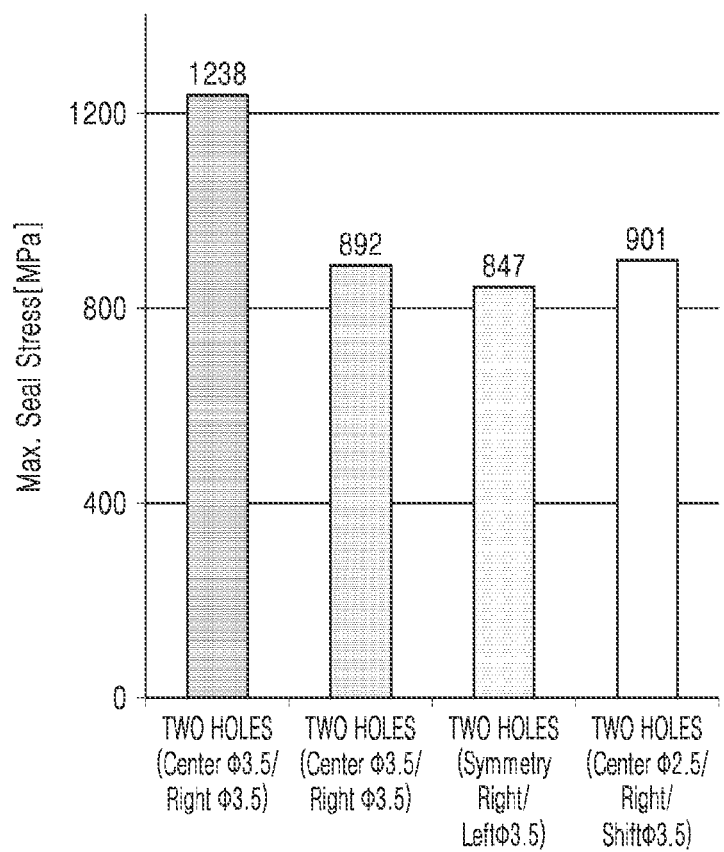
FIG. 27 is a graph showing stress of display panels according to exemplary embodiments when an impact is applied to the display panels.

FIG. 27 is a graph showing stress of display panels according to exemplary embodiments when an impact is applied to the display panels.

Referring to FIG. 27, when an impact is applied to the display apparatuses 1 and 1-1, a substrate and/or an encapsulation substrate (a substrate in the case of FIG. 4) may be damaged or destroyed. An experiment in which the display apparatuses 1 and 1-1 are dropped from a certain height may be performed to check whether this damage occurs, and thus, stress concentrated on through holes included in the substrate and/or the encapsulation substrate (the substrate in the case of FIG. 4) may be measured.

In this method of measuring stress by applying an impact to the display apparatuses 1 and 1-1, stress may be measured by applying an impact to a left lower corner of each of the display apparatuses 1 and 1-1. According to an exemplary embodiment, stress may be measured by applying an impact to a right lower corner of each of the display apparatuses 1 and 1-1. In this case, an impact may be applied to a corner of each of the display apparatuses 1 and 1-1 that is far from through holes formed in each of the display apparatuses 1 and 1-1. For convenience of description, a case in which an impact is applied to a left lower corner of each of the display apparatuses 1 and 1-1 will now be described in detail.

When an impact is applied to a left lower corner of each of the display apparatuses 1 and 1-1 as described above, the impact may be delivered to the entire portion of each of the display apparatuses 1 and 1-1, and may generate stress in the display apparatuses 1 and 1-1. This stress may be concentrated on a portion of each of the display apparatuses 1 and 1-1 in which a through hole has been formed. For example, stress may be concentrated on only a particular portion of the through hole, and the substrate and/or the encapsulation substrate (the substrate in the case of FIG. 4) may be damaged or destroyed due to this stress concentration. This stress may be greatly concentrated on a through hole having a smaller diameter (for example, the second region R2 of FIGS. 14 through 16 and the first region R1-1 of FIGS. 23 and 25) from among the through holes formed in the first and second regions R1 and R2), and on a through hole arranged far from a center line being parallel to a longer edge of the substrate while passing through the center of a shorter edge of the substrate or a through hole (for example, the second region R2 of FIGS. 12 and 13 and the second region R2-1 of FIGS. 18, 22, and 24) located farther from the impact-applied portion of the substrate when through holes formed in the first and second regions R1 and R2 have the same diameters.

In this case, when the stress exceeds a certain value, the substrate and/or the encapsulation substrate (the substrate in the case of FIG. 4) may have cracks or the like, and may be accordingly damaged or destroyed. For example, when the maximum value of stress concentrated on a portion of each through hole exceeds 1200 Mpa (reference value) as shown in FIG. 27, the substrate and/or the encapsulation substrate (the substrate in the case of FIG. 4) may have cracks or the like, and may be accordingly damaged or destroyed.

Referring to the result of FIG. 27, when a through hole having a diameter of 3.5 mm is formed on a center line being parallel to a longer edge of the substrate while passing through the center of a shorter edge of the substrate, and a through hole having a diameter of 2.5 mm, which is smaller than the diameter of 3.5 mm, is formed on the right side of the center line to be apart from the center line, a stress concentrated on the through hole having the smaller diameter has a maximum value of 1238 Mpa, which exceeds the reference value of 1200 MPa. Thus, the substrate and/or the encapsulation substrate (the substrate in the case of FIG. 4) may be damaged or destroyed.

Alternatively, when one of two through holes having the same diameters (3.5 mm) is formed on the center line and the other is formed on the right side of the center line to be apart from the center line, a stress concentrated on the through hole on the right side of the center line has a maximum value of 892 Mpa, which is lower than the reference value of 1200 MPa. Thus, the substrate and/or the encapsulation substrate (the substrate in the case of FIG. 4) may not be damaged or destroyed. According to an exemplary embodiment, when two through holes having the same diameters (3.5 mm) are arranged symmetrically to each other about the center line, a stress concentrated on the through hole on the right side of the center line has a maximum value of 847 Mpa, which is lower than the reference value of 1200 MPa. Thus, the substrate and/or the encapsulation substrate (the substrate in the case of FIG. 4) may not be destroyed. According to an exemplary embodiment, when a through hole having a diameter of 2.5 mm is formed on the center line and a through hole having a diameter of 3.5 mm is formed on the right side of the center line to be apart from the center line, a stress concentrated on the through hole having the smaller diameter (2.5 mm) has a maximum value of 901 Mpa, which is lower than the reference value of 1200 MPa. Thus, the substrate and/or the encapsulation substrate (the substrate in the case of FIG. 4) may not be damaged or destroyed.

Accordingly, it can be seen from the above result that, when through holes having different diameters are formed, arranging a through hole having a smaller diameter to be closer to the center line than a through hole having a greater diameter may improve durability. It can also be seen from the above result that, even when through holes having the same diameters are symmetrical with each other or biased on one side from the center line, the substrate and/or the encapsulation substrate (the substrate in the case of FIG. 4) may not be damaged or destroyed.

Figure 28:
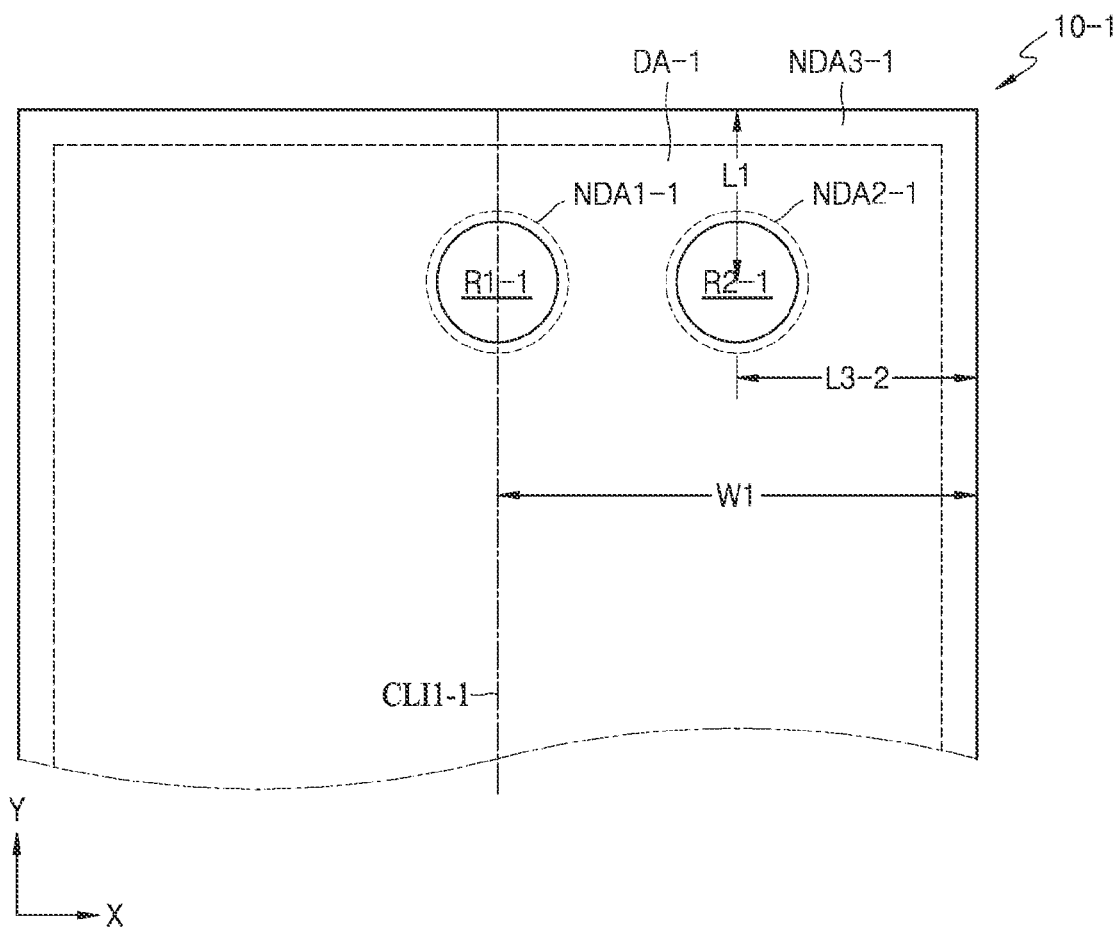
FIG. 28 is a plan view of a display panel of a display apparatus according to an exemplary embodiment.
Figure 29:
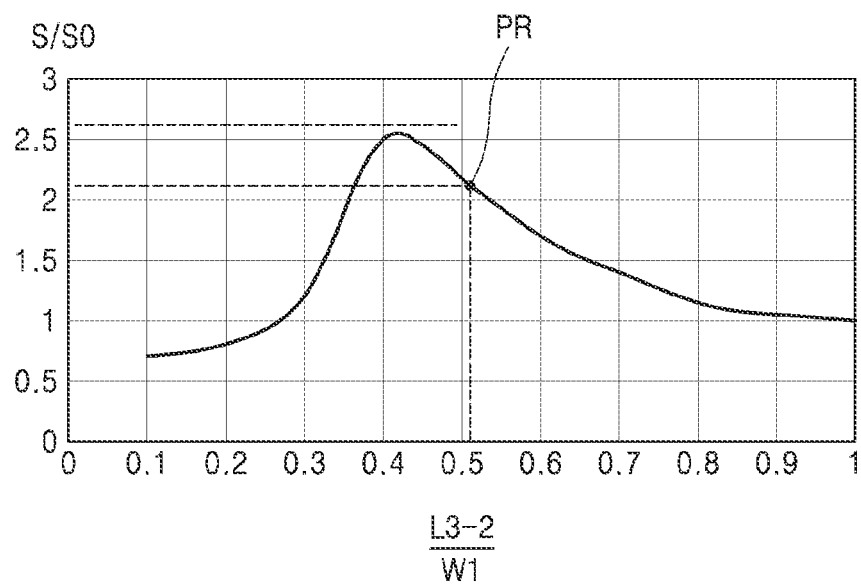
FIG. 29 is a graph showing a stress ratio between a first region and a second region of FIG. 28.
Figure 30:
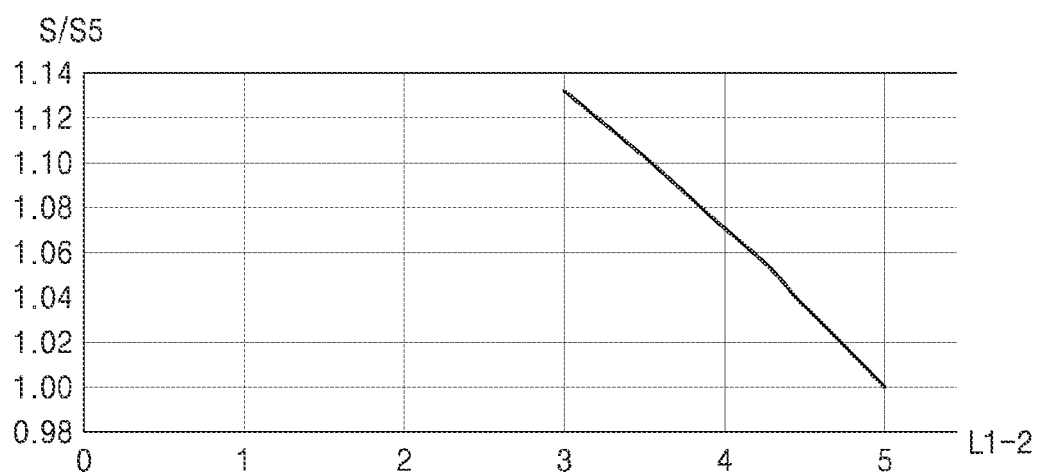
FIG. 30 is a graph showing a stress ratio between the first region and the second region of FIG. 28.

FIG. 28 is a plan view of a display panel 10-1 of a display apparatus according to an exemplary embodiment. FIG. 29 is a graph showing a stress ratio of a first region R1-1 and a second region R2-1 of FIG. 28. FIG. 30 is a graph showing a stress ratio of the first region R1-1 and the second region R2-1 of FIG. 28.

Referring to FIGS. 28 through 30, the display panel 10-1 may be the same as the display panel 10-1 of FIG. 24. The first region R1-1 may be on the first center line CLI1-1, and the second region R2-1 may be disposed between the first center line CLI1-1 and an end (or longer edge) of the display panel 10-1. In this case, the second region R2-1 may have a center at a location that is within about ½ of a distance W1 from the first center line CLI1-1 to the end of the display panel 10-1. The distance W1 is a measured distance from the longer edge of the display panel 10-1 to the first center line CLI1-1, and a distance L3-2 refers to a distance from the longer edge of the display panel 10-1 to a region (or through hole) not arranged on the first center line CLI1-1.

As described above, when an impact is applied to a display apparatus, stress is applied to the display panel 10-1, and the smallest stress may be formed in a through hole arranged in a line being parallel to the longer edge of the display panel 10-1 while passing through the center of the shorter edge of the display panel 10-1. This stress may have a maximum value at a portion of the display panel 10-1 that is located at about ¼ of the distance W1 between the longer edge of the display panel 10-1 and the first center line CLI1-1 from the longer edge of the display panel 10-1. The stress may have an inflection point PR at a portion of the display panel 10-1 that is located at about ½ of the distance W1. A stress S, which is applied to a through hole formed at a portion of the display panel 10-1 where the distance L3-2 from the longer edge of the display panel 10-1 to a region (or through hole) not arranged on the first center line CLI1-1 is about ¼ of the distance W1 between the center of the shorter edge of the display panel 10-1 and the longer edge of the display panel 10-1, may be greater than a stress S0 applied to a through hole arranged on the first center line CLI1-1. In this case, a maximum stress may be about 2.5 times or more of the stress S0 applied to the through hole arranged on the first center line CLI1-1.

In this case, the through hole may crack. Accordingly, stress may decrease in a direction toward the first center line CLI1-1 or the longer edge of the display panel 10-1 from the portion of the display panel 10-1 where the distance L3-2 from the longer edge of the display panel 10-1 to a region (or through hole) not arranged on the first center line CLI1-1 is about ¼ of the distance W1 between the center of the shorter edge of the display panel 10-1 and the longer edge of the display panel 10-1. For example, when the distance L3-2 from the longer edge of the display panel 10-1 to a region (or through hole) not arranged on the first center line CLI1-1 is within about ½ of the distance W1 between the center of the shorter edge of the display panel 10-1 and the longer edge of the display panel 10-1, excessive stress may not be generated, and thus, damage to the through hole due to external stress may be prevented or reduced.

In addition, the rim of the first region R1-1 and the rim of the second region R2-1 may be spaced apart from the shorter edge of the display panel 10-1 by at least about 5 mm. For example, referring to FIG. 30, when a maximum stress S5 generated in through holes arranged in the first region R1-1 and the second region R2-1 is assumed to be 1 when a distance L1-2 by which the rims of the through holes are spaced apart from an end of the display panel 10-1 is about 5 mm, as the distance L1-2 from the shorter edge of the display panel 10-1 increases, the maximum stress S generated in the through holes decreases. In addition, when the distance L1-2 by which the rims of the through holes are spaced apart from an end of the display panel 10-1 is about 5 mm or less, the maximum stress S generated in the through holes increases.

Thus, the rims of the first region R1-1 and the second region R2-1 are designed to be spaced apart from the shorter edge of the display panel 10-1 (or a shorter edge of a substrate and/or an encapsulation substrate) by about 5 mm or greater.

Display apparatuses according to exemplary embodiments may prevent or reduce damage caused to the vicinity of opening areas from being destroyed when an impact is applied thereto.

Moreover, when two opening areas are formed according to exemplary embodiments, the two opening areas may be arranged in a portion of a display apparatus other than a portion that is damaged, and thus, the display apparatus may have increased durability.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:
1. A display apparatus, comprising:
a substrate comprising a first region and a second region, each having a circular shape and spaced apart from each other in a first direction; and
a plurality of display elements arranged in a display area adjacent to the first region and the second region,
wherein the substrate is rectangular and has two shorter edges and two longer edges,
a distance from one of the first region and the second region that is closer to one of the two shorter edges to the one shorter edge is about ⅕ or greater of a length of one of the two longer edges, and
the first region and the second region are arranged between a corner of the substrate and the one shorter edge, a first inflection point of a first stress is generated at a perpendicular distance from a first center line passing through a center of the display area and being parallel to the two shorter edges to each of the two shorter edges by an impact applied to the corner, and a second inflection point of a second stress is generated at a perpendicular distance from a second center line passing through the center of the display area and being parallel to the two longer edges to each of the two longer edges and the second center line by the impact applied to the corner.

2. The display apparatus of claim 1, wherein
one of the first region and the second region is closer to one of the longer edges than the other one of the first region and the second region is, and
a distance from a center of the one of the first region and the second region that is closer to the one of the longer edges to the one of the longer edges is about ½ or greater of a distance from a third center line that passes through respective centers of the two shorter edges.

3. The display apparatus of claim 1, wherein
a distance between a center of the first region and a center of the second region is about ⅔ or less of a length of one of the two shorter edges.

4. The display apparatus of claim 1, wherein
a diameter of the first region is about equal to a diameter of the second region.

5. The display apparatus of claim 1, wherein
a diameter of the first region is different from a diameter of the second region.

6. The display apparatus of claim 5, wherein
a center of one of the first region and the second region is arranged to be eccentric from respective centers of the two shorter edges, with respect to an arbitrary straight line that is parallel to the two longer edges and passes through the respective centers of the two shorter edges.

7. The display apparatus of claim 1, further comprising:
a plurality of through holes arranged in at least one of the first region and the second region that penetrate through the substrate.

8. The display apparatus of claim 1, further comprising:
an encapsulation substrate that faces the substrate; and
a plurality of through holes arranged in at least one of the first region and the second region,
wherein the through holes penetrate through at least one of the substrate and the encapsulation substrate.

9. The display apparatus of claim 1, further comprising:
a transparent material layer arranged in at least one of the first region and the second region.

* * * * *